(12) United States Patent  (10) Patent No.: US 8,916,038 B2
Babayan et al.  (45) Date of Patent: *Dec. 23, 2014

(54) FREE-STANDING METALLIC ARTICLE FOR SEMICONDUCTORS

(71) Applicant: GTAT Corporation, Nashua, NH (US)

(72) Inventors: Steve Babayan, Los Altos, CA (US); Robert Brainard, Sunnyvale, CA (US); Arvind Chari, Saratoga, CA (US); Alejandro de la Fuente Vornbrock, San Carlos, CA (US); Venkatesan Murali, San Jose, CA (US); Gopal Prabhu, San Jose, CA (US); Venkateswaran Subbaraman, San Jose, CA (US); Dong Xu, Fremont, CA (US); Arthur Rudin, Morgan Hill, CA (US); David Tanner, San Jose, CA (US)

(73) Assignee: GTAT Corporation, Merrimack, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/798,123

(22) Filed: Mar. 13, 2013

(65) Prior Publication Data

US 2014/0261654 A1    Sep. 18, 2014

(51) Int. Cl.
*C25D 1/00* (2006.01)
*H01L 31/0224* (2006.01)
*C25D 1/10* (2006.01)

(52) U.S. Cl.
CPC .......... *H01L 31/022425* (2013.01); *C25D 1/10* (2013.01)
USPC ................................ 205/78; 205/67; 205/122

(58) Field of Classification Search
CPC ............ C25D 5/02; C25D 5/022; C25D 1/00; C25D 1/04; C25D 1/08; C25D 1/10; H01L 31/02021; H01L 31/022425
USPC .......................................... 205/70, 76, 77, 78
See application file for complete search history.

(56) References Cited

U.S. PATENT DOCUMENTS

RE25,647 E    9/1964  Mann et al.
3,442,007 A   5/1969  Griffin et al.
(Continued)

FOREIGN PATENT DOCUMENTS

JP    2012204660 A    10/2012
KR   20080050862 A    6/2008
(Continued)

OTHER PUBLICATIONS

Lui, K., Yasui, R.K. "Electroformed Al contact solar cells without soldering, investigating process parameters effects on performance" IEEE Photovoltaic Specialist Conf., Aug. 4-6, 1970, p. 62-69.*

(Continued)

*Primary Examiner* — Luan Van
*Assistant Examiner* — Louis Rufo
(74) *Attorney, Agent, or Firm* — The Mueller Law Office, P.C.

(57) ABSTRACT

A free-standing metallic article, and method of making, is disclosed in which the metallic article is electroformed on an electrically conductive mandrel. The mandrel has an outer surface with a preformed pattern, wherein at least a portion of the metallic article is formed in the preformed pattern. The metallic article is separated from the electrically conductive mandrel, which forms a free-standing metallic article that may be coupled with the surface of a semiconductor material for a photovoltaic cell.

23 Claims, 16 Drawing Sheets

(56) References Cited

U.S. PATENT DOCUMENTS

| | | | |
|---|---|---|---|
| 3,483,038 A | 12/1969 | Hui et al. | |
| 4,336,648 A | 6/1982 | Pschunder et al. | |
| 4,380,112 A | 4/1983 | Little | |
| 4,443,652 A | 4/1984 | Izu et al. | |
| 4,542,255 A | 9/1985 | Tanner et al. | |
| 4,574,160 A | 3/1986 | Cull et al. | |
| 4,590,327 A | 5/1986 | Nath et al. | |
| 4,652,693 A | 3/1987 | Bar-On | |
| 4,695,674 A * | 9/1987 | Bar-on | 136/256 |
| 4,871,623 A * | 10/1989 | Hoopman et al. | 428/586 |
| 4,915,743 A | 4/1990 | Schilling | |
| 5,011,565 A | 4/1991 | Dube et al. | |
| 5,045,481 A | 9/1991 | Schilling et al. | |
| 5,178,685 A | 1/1993 | Borenstein et al. | |
| 5,236,572 A | 8/1993 | Lam et al. | |
| 5,542,988 A | 8/1996 | Bogus | |
| 5,620,528 A | 4/1997 | Schade et al. | |
| 5,620,904 A | 4/1997 | Hanoka | |
| 5,661,041 A | 8/1997 | Kano | |
| 5,759,291 A | 6/1998 | Ichinose et al. | |
| RE37,512 E * | 1/2002 | Szlufcik et al. | 438/57 |
| 6,448,492 B1 | 9/2002 | Okada et al. | |
| 6,547,944 B2 | 4/2003 | Schreiber et al. | |
| 7,022,910 B2 | 4/2006 | Gaudiana et al. | |
| 7,097,754 B2 | 8/2006 | Warlimont | |
| 7,432,438 B2 | 10/2008 | Rubin et al. | |
| 7,531,120 B2 | 5/2009 | Van Rijn et al. | |
| 7,635,810 B2 | 12/2009 | Luch | |
| 7,704,352 B2 * | 4/2010 | Lopatin et al. | 204/198 |
| 7,732,243 B2 | 6/2010 | Luch | |
| 7,749,883 B2 | 7/2010 | Meeus et al. | |
| 7,781,672 B2 | 8/2010 | Gaudiana et al. | |
| 7,799,182 B2 | 9/2010 | Lopatin et al. | |
| 7,851,700 B2 | 12/2010 | Luch | |
| 7,852,543 B2 | 12/2010 | Goetz et al. | |
| 7,868,249 B2 | 1/2011 | Luch | |
| 7,989,692 B2 | 8/2011 | Luch | |
| 8,013,239 B2 | 9/2011 | Rubin et al. | |
| 8,066,840 B2 | 11/2011 | Narasimhan et al. | |
| 8,076,568 B2 | 12/2011 | Luch et al. | |
| 8,110,737 B2 | 2/2012 | Luch | |
| 8,120,132 B2 | 2/2012 | Guha et al. | |
| 8,138,413 B2 | 3/2012 | Luch et al. | |
| 8,163,332 B2 | 4/2012 | Emoto et al. | |
| 8,222,513 B2 | 7/2012 | Luch | |
| 8,319,097 B2 | 11/2012 | Luch | |
| 8,569,096 B1 * | 10/2013 | Babayan et al. | 438/66 |
| 8,629,061 B2 | 1/2014 | Murali et al. | |
| 8,691,620 B2 | 4/2014 | Lee et al. | |
| 8,697,980 B2 | 4/2014 | Paulson et al. | |
| 8,729,385 B2 | 5/2014 | Luch | |
| 2004/0115536 A1 | 6/2004 | Blankenborg et al. | |
| 2004/0187911 A1 | 9/2004 | Gaudiana et al. | |
| 2008/0102558 A1 | 5/2008 | Fork et al. | |
| 2009/0081823 A1 | 3/2009 | Meeus et al. | |
| 2010/0000602 A1 | 1/2010 | Gray et al. | |
| 2010/0012172 A1 | 1/2010 | Meakin et al. | |
| 2010/0021695 A1 * | 1/2010 | Naoyuki et al. | 428/173 |
| 2010/0031999 A1 | 2/2010 | Mishima et al. | |
| 2010/0071765 A1 | 3/2010 | Cousins et al. | |
| 2010/0096569 A1 * | 4/2010 | Nguyen et al. | 250/505.1 |
| 2010/0243024 A1 | 9/2010 | Hashimoto et al. | |
| 2010/0275976 A1 | 11/2010 | Rubin et al. | |
| 2010/0291385 A1 * | 11/2010 | Greer et al. | 428/398 |
| 2011/0174354 A1 | 7/2011 | Kutzer et al. | |
| 2011/0203654 A1 | 8/2011 | Kihara et al. | |
| 2011/0247859 A1 * | 10/2011 | Zagdoun et al. | 174/250 |
| 2011/0273085 A1 | 11/2011 | Garbar et al. | |
| 2011/0315217 A1 | 12/2011 | Gee | |
| 2012/0125434 A1 | 5/2012 | Doi | |
| 2012/0132273 A1 | 5/2012 | Lee et al. | |
| 2012/0180850 A1 | 7/2012 | Kim et al. | |
| 2012/0204938 A1 | 8/2012 | Hacke et al. | |
| 2012/0308476 A1 | 12/2012 | Kim et al. | |

FOREIGN PATENT DOCUMENTS

| | | |
|---|---|---|
| WO | 2008080160 A | 7/2008 |
| WO | 2009032021 A | 3/2009 |
| WO | 2013090562 A | 6/2013 |

OTHER PUBLICATIONS

Day4 Energy, "Day4 stay-powerful Technology", YouTube, Web, Uploaded May 6, 2011, www.youtube.com/watch?v=k8RgNwtApF0&feature=youtu.be.

Notice of Allowance and Fees dated Sep. 18, 2013 for U.S. Appl. No. 13/798,124.

Office Action dated Feb. 24, 2014 for U.S. Appl. No. 14/079,540.

Office Action dated Apr. 10, 2014 for U.S. Appl. No. 14/045,780.

International Search Report and Written Opinion dated May 28, 2014 for PCT Patent Application No. PCT/US2014/018490.

International Search Report and Written Opinion dated May 28, 2014 for PCT Patent Application No. PCT/US2014/018494.

International Search Report and Written Opinion dated May 29, 2014 for PCT Application No. PCT/US2014/018489.

International Search Report and Written Opinion dated Jun. 16, 2014 for PCT Patent Application No. PCT/US2014/022216.

Office Action dated Sep. 9, 2014 for U.S. Appl. No. 14/045,780.

* cited by examiner

FREE-STANDING METALLIC ARTICLE FOR SEMICONDUCTORS

RELATED APPLICATIONS

This application is related to 1) Babayan et al., U.S. patent application Ser. No. 13/798,124, entitled "Free-Standing Metallic Article for Semiconductors" and filed on Mar. 13, 2013; 2) Babayan et al., U.S. Provisional Patent Application No. 61/778,443, entitled "Free-Standing Metallic Article for Semiconductors" and filed on Mar. 13, 2013; and 3) Babayan et al., U.S. Provisional Patent Application No. 61/778,444, entitled "Free-Standing Metallic Article for Semiconductors" and filed on Mar. 13, 2013; all of which are owned by the assignee of the present application, and are hereby incorporated by reference.

BACKGROUND OF THE INVENTION

A solar cell is a device that converts photons into electrical energy. The electrical energy produced by the cell is collected through electrical contacts coupled to the semiconductor material, and is routed through interconnections with other photovoltaic cells in a module. The "standard cell" model of a solar cell has a semiconductor material, used to absorb the incoming solar energy and convert it to electrical energy, placed below an anti-reflective coating (ARC) layer, and above a metal backsheet. Electrical contact is typically made to the semiconductor surface with fire-through paste, which is metal paste that is heated such that the paste diffuses through the ARC layer and contacts the surface of the cell. The paste is generally patterned into a set of fingers and bus bars which will then be soldered with ribbon to other cells to create a module. Another type of solar cell has a semiconductor material sandwiched between transparent conductive oxide layers (TCO's), which are then coated with a final layer of conductive paste that is also configured in a finger/bus bar pattern.

In both these types of cells, the metal paste, which is typically silver, works to enable current flow in the horizontal direction (parallel to the cell surface), allowing connections between the solar cells to be made towards the creation of a module. Solar cell metallization is most commonly done by screen printing a silver paste onto the cell, curing the paste, and then soldering ribbon across the screen printed bus bars. However, silver is expensive relative to other components of a solar cell, and can contribute a high percentage of the overall cost.

To reduce silver cost, alternate methods for metallizing solar cells are known in the art. For example, attempts have been made to replace silver with copper, by plating copper directly onto the solar cell. However, a drawback of copper plating is contamination of the cell with copper, which impacts reliability. Plating throughput and yield can also be issues when directly plating onto the cell due to the many steps required for plating, such as depositing seed layers, applying masks, and etching or laser scribing away plated areas to form the desired patterns. Other methods for forming electrical conduits on solar cells include utilizing arrangements of parallel wires or polymeric sheets encasing electrically conductive wires, and laying them onto a cell. However, the use of wire grids presents issues such as undesirable manufacturing costs and high series resistance.

SUMMARY OF THE INVENTION

A free-standing metallic article, and method of making, is disclosed in which a metallic article is electroformed on an electrically conductive mandrel. The mandrel has an outer surface with a preformed pattern, wherein at least a portion of the metallic article is formed in the preformed pattern. The metallic article is separated from the electrically conductive mandrel, which forms a free-standing metallic article that may be coupled with the surface of a semiconductor material for a photovoltaic cell.

BRIEF DESCRIPTION OF THE DRAWINGS

Each of the aspects and embodiments of the invention described herein can be used alone or in combination with one another. The aspects and embodiments will now be described with reference to the attached drawings.

DETAILED DESCRIPTION OF THE EMBODIMENTS

Figure 1A:
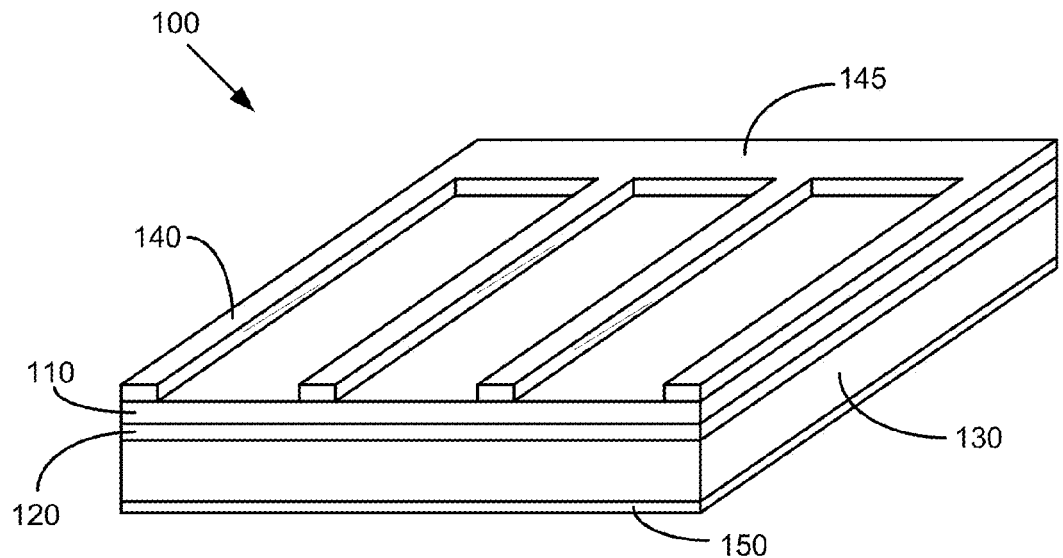
FIG. 1A is a perspective view of a conventional solar cell.

FIG. 1A is a simplified schematic of a conventional solar cell 100 which includes an anti-reflective coating (ARC) layer 110, an emitter 120, a base 130, front contacts 140, and a rear contact layer 150. Emitter 120 and base 130 are semiconductor materials that are doped as p+ or n− regions, and may be referred to together as an active region of a solar cell. Front contacts 140 are typically fired through anti-reflective coating layer 110 in order to make electrical contact with the active region. Incident light enters the solar cell 100 through ARC layer 110, which causes a photocurrent to be created at the junction of the emitter 120 and base 130. It can be seen that shading caused by front contacts 140 will affect the efficiency of the cell 100. The produced electrical current is collected through an electrical circuit connected to front contacts 140 and rear contact 150. A bus bar 145 may connect the front contacts 140, which are shown here as finger elements. Bus bar 145 collects the current from front contacts 140, and also may be used to provide interconnection between other solar cells. The assembly of front contacts 140 and bus bar 145 may also be referred to as a metallization layer. In other types of solar cells, a transparent conductive oxide (TCO) layer may be used instead of a dielectric-type ARC layer, to collect electrical current. In a TCO type of cell, metallization in the form of, for example, front contacts 140 and bus bar 145 would be fabricated onto the TCO layer, without the need for firing through, to collect current from the TCO solar cell.

Figure 1B:
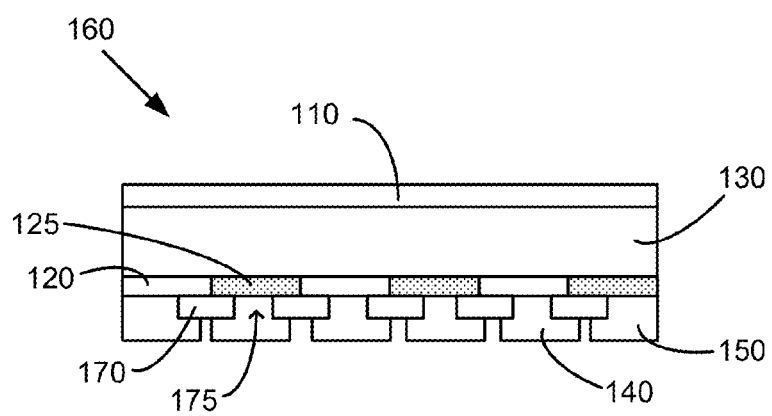
FIG. 1B is a cross-sectional view of a conventional back-contact solar cell.

FIG. 1B illustrates a simplified schematic of another type of solar cell 160, in which the electrical contacts are made on the back side, opposite of where light enters. Solar cell 160, also known as an interdigitated back contact cell, includes an ARC layer 110, a base region 130 made of a semiconductor substrate, and doped regions 120 and 125 having opposite polarities from each other (e.g., p-type and n-type). Doped regions 120 and 125 are on the back side of cell 160, opposite of ARC layer 110. A non-conducting layer 170 provides separation between the doped regions 120 and 125, and also completes the role of passivation of the back surface of cell 160. Electrical contacts 140 and 150 are interdigitated with each other and make electrical connections to doped regions 120 and 125, respectively, through holes 175 in the passivating layer 170. Although the electrical contacts 140 and 150 do not present a shading issue in this back-contact type of solar cell, they may still present other issues such as manufacturing yield losses when forming the contacts onto the cell, high material costs if using silver for the contacts, or degradation of the cell if using copper for the contacts.

Metallization of solar cells typically involves screen printing a silver paste in the desired pattern of the electrical contacts to be connected to the cell. In FIG. 1A, the front contacts 140 are configured in a linear pattern of parallel segments. Because the cost of silver can add greatly to the expense of the solar cell, it is highly desirable to reduce or even eliminate the use of silver. Copper is an attractive alternative to silver because of its high electrical conductivity, but can lead to contamination of the semiconductor materials and consequently reduced performance of the solar cell. Known methods of utilizing copper in solar cells involve depositing copper directly onto the cell. However, these methods require subjecting the solar cells to the temperatures and chemicals involved with the many steps during these plating processes, which can cause damage to the cell. In other known methods, arrangements of parallel copper wires or woven grids of wires are produced separately from the cell, and then joined to the cell. However, with these methods it can be difficult to align the wires to the cell, or to produce wires small enough to be functional but yet minimize shading on a solar cell. Wire grids encapsulated within polymeric films have also been produced, but these methods can be complex and still present shading and alignment problems, particularly due to the presence of the polymeric sheet. Copper paste is another alternative, but these pastes can be difficult to apply and still present the problem of diffusion into the solar cell.

In the present disclosure, electrical conduits for semiconductors, such as photovoltaic cells, are fabricated as an electroformed free-standing metallic article. The metallic articles are produced separately from a solar cell and can include multiple elements such as fingers and bus bars that can be transferred stably as a unitary piece and easily aligned to a semiconductor device. The elements of the metallic article are formed integrally with each other in the electroforming process. The metallic article is manufactured in an electroforming mandrel, which generates a patterned metal layer that is tailored for a solar cell or other semiconductor device. For example, the metallic article may have grid lines with height-to-width aspect ratios that minimize shading for a solar cell. The metallic article can replace conventional bus bar metallization and ribbon stringing for cell metallization, cell-to-cell interconnection and module making. The ability to produce the metallization layer for a photovoltaic cell as an independent component that can be stably transferred between processing steps provides various advantages in material costs and manufacturing.

Figure 2:
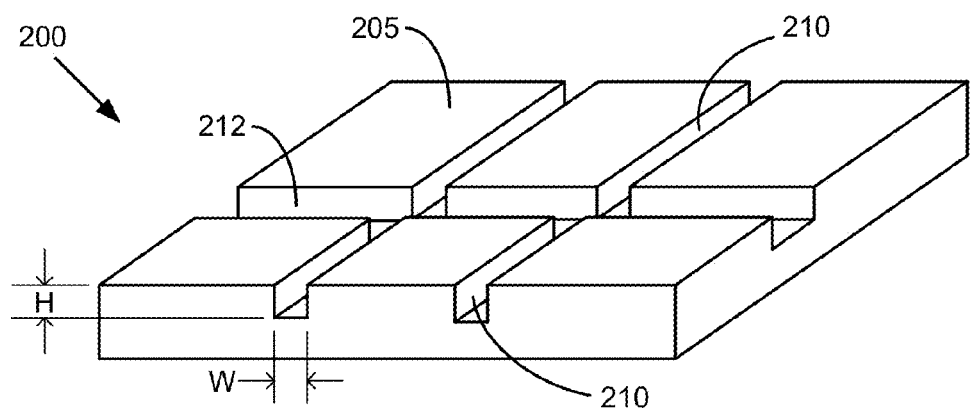
FIG. 2 shows a perspective view of an exemplary electroforming mandrel in one embodiment.

FIG. 2 depicts a perspective view of a portion of an exemplary electroforming mandrel 200 in one embodiment. The mandrel 200 may be made of electrically conductive material such stainless steel, copper, anodized aluminum, titanium, or molybdenum, nickel, nickel-iron alloy (e.g., Invar), copper, or any combinations of these metals, and may be designed with sufficient area to allow for high plating currents and enable high throughput. The mandrel 200 has an outer surface 205 with a preformed pattern that comprises pattern elements 210 and 212 and can be customized for a desired shape of the electrical conduit element to be produced. In this embodiment, the pattern elements 210 and 212 are grooves or trenches with a rectangular cross-section, although in other embodiments, the pattern elements 210 and 212 may have other cross-sectional shapes. The pattern elements 210 and 212 are depicted as intersecting segments to form a grid-type pattern, in which sets of parallel lines intersect perpendicularly to each other in this embodiment.

The pattern elements 210 have a height 'H' and width 'W', where the height-to-width ratio defines an aspect ratio. By using the pattern elements 210 and 212 in the mandrel 200 to form a metallic article, the electroformed metallic parts can be tailored for photovoltaic applications. For example, the aspect ratio may be between about 0.01 and about 10. In some embodiments, the aspect ratio can be designed to be greater than 1, such as between about 1 and about 10, or between about 1 and about 5. Having a height greater than the width allows the metal layer to carry enough current but reduce the shading on the cell compared to, for example, standard circular wires which have an aspect ratio of 1, or compared to conventional screen-printed patterns which are horizontally flat and have aspect ratios less than 1. Shading values for screen-printed metal fingers may be, for example, over 6%. With metallic articles having tailored aspect ratios as described herein, shading values of less than 6% may be achieved, such as between 4-6%. Thus, the ability to produce electrical conduits with aspect ratios greater than 1 enable minimal aperture loss to a photovoltaic cell, which is important to maximizing efficiency. In embodiments where the electroformed electrical conduit is used on a back surface of a solar cell, aspect ratios of other values, such as less than 1, may be used.

The aspect ratio, as well as the cross-sectional shape and longitudinal layout of the pattern elements, may be electroformed to meet desired specifications such as electrical current capacity, series resistance, shading losses, and cell layout. Any electroforming process can be used. For example, the metallic article may be formed by an electroplating process. In particular, because electroplating is generally an isotropic process, confining the electroplating with a pattern mandrel to customize the shape of the parts is a significant improvement for maximizing efficiency. Furthermore, although tall yet narrow conduit lines typically would tend to be unstable when placing them on a semiconductor surface, the customized patterns that may be produced through the use of a mandrel allows for features such as interconnecting lines to provide stability for these tall but narrow conduits. In some embodiments, for example, the preformed patterns may be configured as a continuous grid with intersecting lines. This configuration not only provides mechanical stability to the plurality of electroformed elements that form the grid, but also enables a low series resistance since the current is spread over more conduits. A grid-type structure can also increase the robustness of a cell. For example, if some portion of the grid becomes broken or non-functional, the electrical current can flow around the broken area due to the presence of the grid pattern.

Figure 3A:
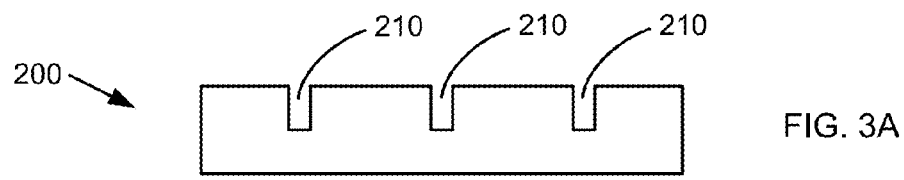
FIGS. 3A-3C depict cross-sectional views of exemplary stages in producing a free-standing electroformed metallic article.
Figure 3B:
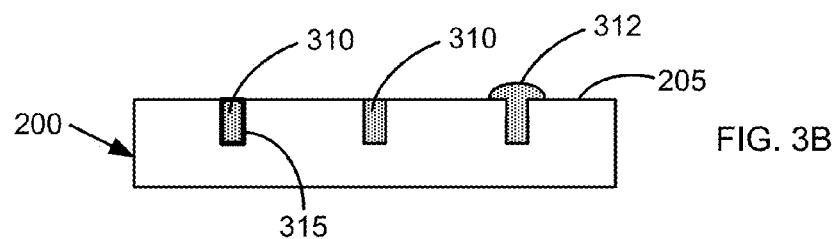
Figure 3C:
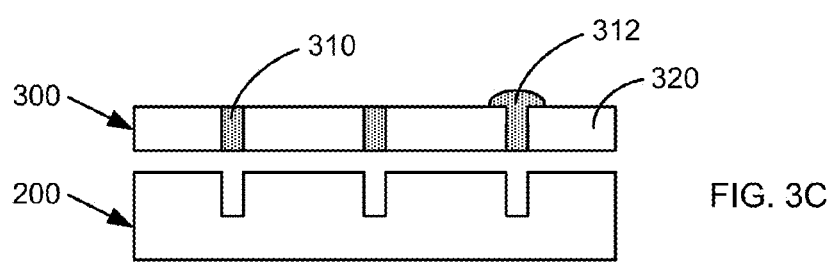

FIGS. 3A-3C are simplified cross-sectional views of exemplary stages in producing a metal layer piece using a mandrel. In FIG. 3A, a mandrel 200 with pattern elements 210 is provided. The mandrel 200 is subjected to an electroforming process, in which electroformed elements 310 are formed within the pattern elements 210 as shown in FIG. 3B. In the embodiment of FIGS. 3A-3C, the pattern elements 210 have been designed with a higher aspect ratio than those in FIG. 2. The electroformed elements 310 may be, for example, copper only, or in other embodiments, alloys of copper. In other embodiments, a layer of nickel may be plated onto the mandrel 200 first, followed by copper so that the nickel provides a barrier against copper contamination of a finished semiconductor device. An additional nickel layer may optionally be plated over the top of the electroformed elements 310 to encapsulate the copper, as depicted by nickel layer 315 in FIG. 3B. In other embodiments, multiple layers may be plated within the pattern elements 210, using various metals as desired to achieve the necessary properties of the metallic article to be produced.

In FIG. 3B the electroformed elements 310 are shown as being formed flush with the outer surface 205 of mandrel 200. Electroformed element 312 illustrates another embodiment in which the elements may be overplated. For electroformed element 312, electroplating continues until the metal extends above the surface 205 of mandrel 200. The overplated portion, which typically will form as a rounded top due to the isotropic nature of electroforming, may serve as a handle to facilitate the extraction of the electroformed element 312 from mandrel 200. The rounded top of electroformed element 312 may also provide optical advantages in a photovoltaic cell by, for example, being a refractive surface to aid in light collection. In yet other embodiments not shown, a metallic article may have portions that are formed on top of the surface 205, such as a bus bar, in addition to those that are formed within the preformed patterns 210.

In FIG. 3C the electroformed elements 310 are removed from the mandrel 200 as a free-standing metallic article 300. The electroformed elements 310 may include intersecting elements 320, such as would be formed by patterns 212 of FIG. 2. The intersecting elements 320 may assist in making the metallic article 300 a unitary, free-standing piece such that it may be easily transferred to other processing steps while keeping the individual elements 310 and 320 aligned with each other. The additional processing steps may include coating steps for the free-standing metallic article 300 and assembly steps to incorporate it into a semiconductor device. By producing the metal layer of a semiconductor as a free-standing piece, the manufacturing yields of the overall semiconductor assembly will not be affected by the yields of the metal layer. In addition, the metal layer can be subjected to temperatures and processes separate from the other semiconductor layers. For example, the metal layer may be undergo high temperature processes or chemical baths that will not affect the rest of the semiconductor assembly.

After the metallic article 300 is removed from mandrel 200 in FIG. 3C, the mandrel 200 may be reused to produce additional parts. Being able to reuse the mandrel 200 provides a significant cost reduction compared to current techniques where electroplating is performed directly on a solar cell. In direct electroplating methods, masks or mandrels are formed on the cell itself, and thus must be built and often destroyed on every cell. Having a reusable mandrel reduces processing steps and saves cost compared to techniques that require patterning and then plating a semiconductor device. In other conventional methods, a thin printed seed layer is applied to a semiconductor surface to begin the plating process. However, seed layer methods result in low throughputs. In contrast, reusable mandrel methods as described herein can utilize mandrels of thick metal which allow for high current capability, resulting in high plating currents and thus high throughputs. Metal mandrel thicknesses may be, for example, between 0.2 to 5 mm.

Figure 4:
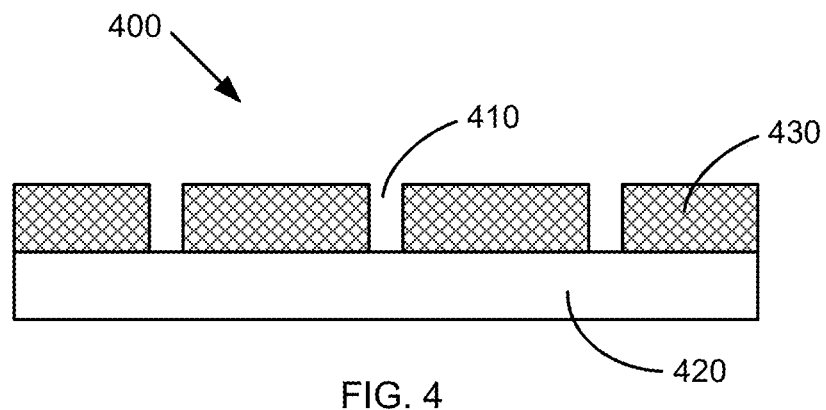
FIG. 4 provides a cross-sectional view of one embodiment of an electrically conductive mandrel.
Figure 5:
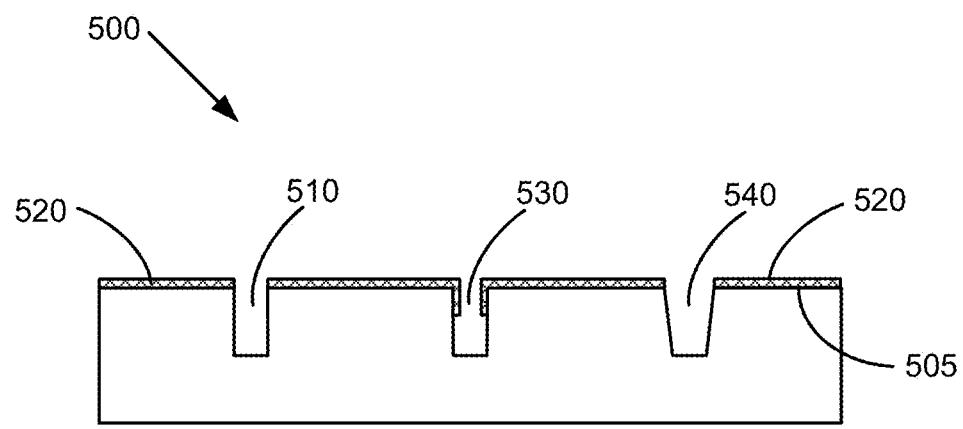
FIG. 5 provides a cross-sectional view of another embodiment of an electrically conductive mandrel.

FIGS. 4-5 are cross-sectional views of exemplary mandrels, demonstrating embodiments of various mandrel and pattern designs. In FIG. 4, a planar metal mandrel base 420 has a dielectric layer 430 laid over it. The pattern including pattern elements 410 for forming a metallic article are created in dielectric layer 430. The dielectric layer 430 may be, for example, a fluoropolymer (e.g., Teflon®), a patterned photoresist (e.g., Dupont Riston® thick film resist), or a thick layer of epoxy-based photoresist (e.g., SU-8). The photoresist is selectively exposed and removed to reveal the desired pattern. In other embodiments, the dielectric layer 430 may be patterned by, for example, machining or precision laser cutting. In this type of mandrel 400 with dielectric-surrounded pattern elements, electroplating will fill the trenches of pattern elements 410 from the bottom up, starting at the metal mandrel base 420. The use of dielectrics or permanent resists allows for reuse of the mandrel 400, which reduces the number of process steps, consumable costs, and increases throughput of the overall manufacturing process compared to consumable mandrels.

FIG. 5 shows another mandrel 500 made primarily of metal, including the cavities for forming a metallic article. When electroforming with metal mandrel 500, the metal surfaces of a pattern element 510 allow for rapid plating from all three sides of the trench pattern. In some embodiments of mandrel 500, a release layer 520 such as a dielectric or low-adhesion material (e.g., a fluoropolymer) may optionally be coated onto the mandrel 500, in various areas as desired. The release layer 520 may reduce adhesion of the electroformed part to the mandrel 500, or may minimize adhesion of a substrate, such as an adhesive film, that may be used to peel the electroformed article from the mandrel. The release layer 520 may be patterned simultaneously with the metal mandrel, or may be patterned in a separate step, such as through photoresist with wet or dry etching. The pattern elements 510, 530 and 540 in the metal mandrel, may be, for example, grooves and intersecting trenches, and may be formed by, for instance, machining, laser cutting, lithography, or electroforming. In other embodiments, the mandrel 500 may not require a release layer 520 if the surface of the mandrel that is exposed to the plating solution is selected to have poor adhesion to the metallic article. For instance, for electroformed parts that will have a first layer (that is, an outer layer) of nickel plating, the mandrel 400 may be made of copper. Copper has low adhesion to nickel and thereby allows the formed, nickel-coated piece to be easily removed from the copper mandrel. When applying a release layer 520 to mandrel 500, the relative depth of the trench pattern element 510 in the metal and the thickness of the dielectric coating can be selected to minimize void formation of the metal piece formed within pattern element 510, while still enabling a high plating rate.

FIG. 5 shows a further embodiment in which the release layer 520 has been extended partially into the depth of pattern element 530. This extension of the coating into pattern element 530 may enable electroforming rates between that of dielectrically-surrounded pattern element 410 of FIG. 4 and metal-surrounded pattern element 510 of FIG. 5. The amount that release layer 520 extends into the pattern element 530 may be chosen to achieve a desired electroforming rate. In some embodiments, release layer 520 may extend into pattern element 530 by, for example, approximately half the amount of the pattern width. A pattern element 530 with release layer 520 extending into the trench can allow a more uniform electroplating rate within the trench, and hence, a more uniform grid can be produced. The amount that the dielectric or release layer 520 extends into the trench can be modified to optimize overall plating rate and plating uniformity.

FIG. 5 shows yet another embodiment of mandrel 500 in which the pattern element 540 has tapered walls. The tapered walls are wider at the outer surface 505 of mandrel 500, to facilitate removal of a formed metallic element from the patterned mandrel. In other embodiments not shown, the cross-sectional shape of the preformed patterns for any of the mandrels described herein may include shapes such as, but not limited to, curved cross-sections, beveled edges at the corners of a pattern's cross-section, curved paths along the length of a pattern, and segments intersecting each other at various angles to each other.

Figure 6A:
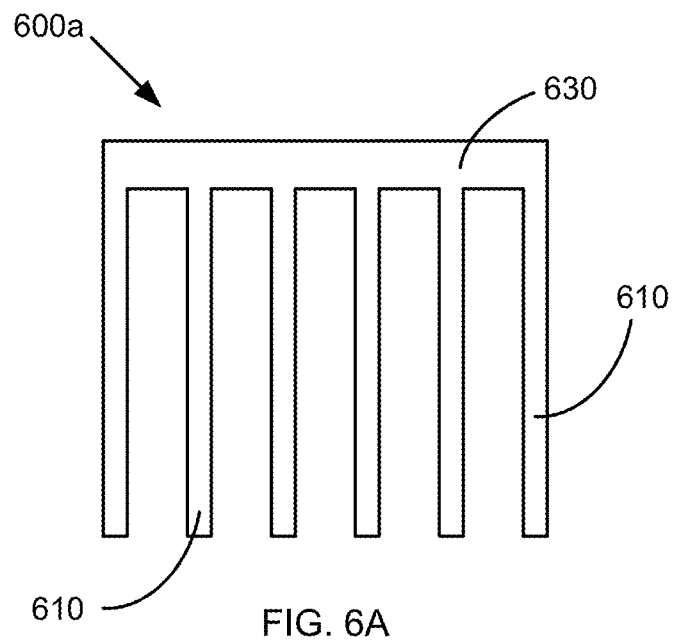
FIGS. 6A-6B are top views of two embodiments of metallic articles.
Figure 6B:
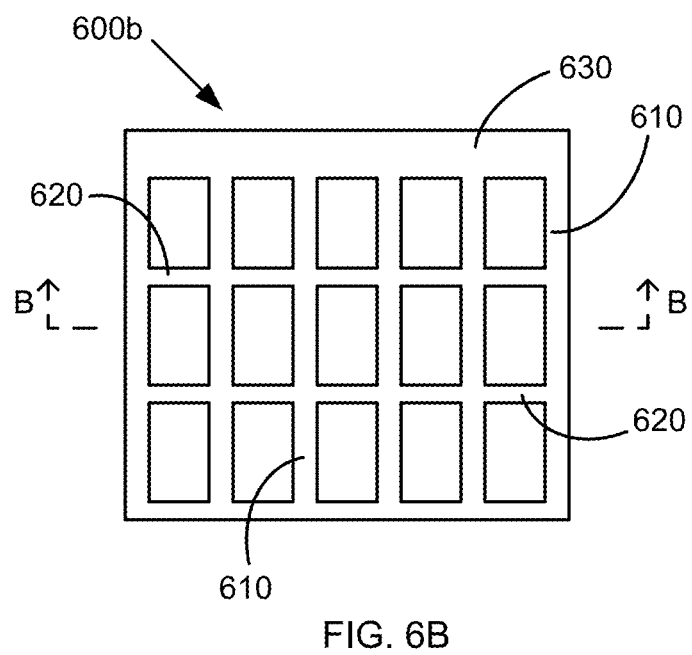

FIGS. 6A and 6B illustrate top views of exemplary metal layers 600a and 600b that may be produced by the electroforming mandrels described herein. Metal layers 600a and 600b include electroformed elements embodied here as substantially parallel fingers 610, which have been formed by substantially parallel grooves in an electrically conductive mandrel. Metal layer 600b also includes electroformed elements embodied here as horizontal fingers 620 that intersect vertical fingers 610, where the fingers 610 and 620 intersect at approximately a perpendicular angle. In other embodiments, fingers 610 and 620 may intersect at other angles, while still forming a continuous grid or mesh pattern. Metal layers 600a and 600b also include a frame element 630 which may serve as a bus bar to collect current from the fingers 610 and 620. Having a bus bar integrally formed as part of the metallic article can provide manufacturing improvements. In present high-volume methods of solar module production, cell connections are often achieved by manually soldering metal ribbons to the cells. This commonly results in broken or damaged cells due to manual handling and stress imparted on the cells by the solder ribbons. In addition, the manual soldering process results in high labor-related production costs. Thus, having a bus bar or ribbon already formed and connected to the metallization layer, as is possible with the electroformed metallic articles described herein, enables low-cost, automated manufacturing methods.

Frame element 630 may also provide mechanical stability such that metal layers 600a and 600b are unitary, free-standing pieces when removed from a mandrel. That is, the metal layers 600a and 600b are unitary in that they are a single component, with the fingers 610 and 620 remaining connected, when apart from a photovoltaic cell or other semiconductor assembly. Frame element 630 may furthermore assist in maintaining spacing and alignment between finger elements 610 and 620 for when they are to be attached to a photovoltaic cell. Frame element 630 is shown in FIGS. 6A-6B as extending across one edge of metal layers 600a and 600b. However, in other embodiments, a frame element may extend only partially across one edge, or may border more than one edge, or may be configured as one or more tabs on an edge, or may reside within the grid itself. Furthermore, frame element may be electroformed at the same time as the fingers 610 and 620, or in other embodiments may be electroformed in a separate step, after fingers 610 and 620 have been formed.

Figure 6C:
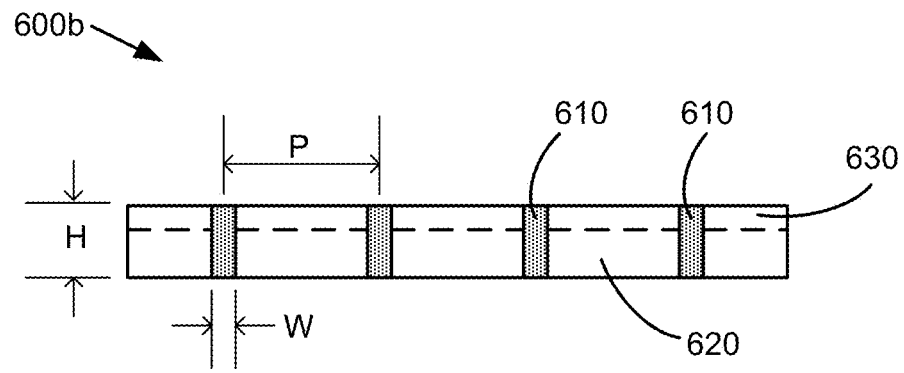
FIG. 6C is a cross-sectional view of section B-B of FIG. 6B.

FIG. 6C shows a cross-section of metal layer 600b taken at section B-B of FIG. 6B. Fingers 610 in this embodiment are shown in as having aspect ratios greater than 1, such as about 1 to about 5, and such as approximately 2 in this figure. Having a cross-sectional height greater than the width reduces the shading impact of metal layer 600b on a photovoltaic cell. In various embodiments, only a portion of the fingers 610 and 620 may have an aspect ratio greater than 1, or a majority of the fingers 610 and 620 may have an aspect ratio greater than 1, or all of the fingers 610 and 620 may have an aspect ratio greater than 1. Height 'H' of fingers 610 may range from, for example, about 5 microns to about 200 microns, or about 10 microns to about 300 microns. Width 'W' of fingers 610 may range from, for example, about 10 microns to about 5 mm, such as about 10 microns to about 150 microns. The distance between parallel fingers 610 has a pitch 'P', measured between the centerline of each finger. In some embodiments the pitch may range, for example, between about 1 mm and about 25 mm. In FIGS. 6B and 6C, the fingers 610 and 620 have different widths and pitches, but are approximately equivalent in height. In other embodiments, the fingers 610 and 620 may have different widths, heights and pitches as each other, or may have some characteristics that are the same, or may have all the characteristics the same. The values may be chosen according to factors such as the size of the photovoltaic cell, the shading amount for a desired efficiency, or whether the metallic article is to be coupled to the front or rear of the cell. In some embodiments, fingers 610 may have a pitch between about 1.5 mm and about 6 mm and fingers 620 may have a pitch between about 1.5 mm and about 25 mm. Fingers 610 and 620 are formed in mandrels having grooves that are substantially the same shape and spacing as fingers 610 and 620. Frame element 630 may have the same height as the fingers 610 and 620, or may be a thinner piece as indicated by the dashed line in FIG. 6C. In other embodiments, frame element 630 may be formed on above finger elements 610 and 620.

Figure 6D:
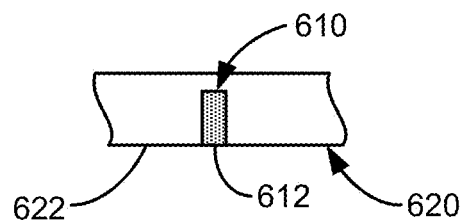
FIGS. 6D-6E are partial cross-sectional views of yet further embodiments of the cross-section of FIG. 6B.
Figure 6E:
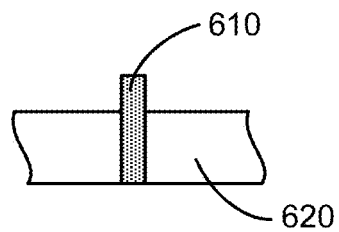

FIG. 6C also shows that fingers 610 and 620 may be substantially coplanar with each other, in that the fingers 610 and fingers 620 have a majority of their cross-sectional areas that overlap each other. Compared to conventional meshes that are woven over and under each other, a coplanar grid as depicted in FIG. 6C can provide a lower profile than overlapping circular wires of the same cross-sectional area. The intersecting, coplanar lines of metal layer 600b are also formed integrally with each other during the electroforming process, which provides further robustness to the free-standing article of metal layer 600b. That is, the integral elements are formed as one piece and not joined together from separate components. FIGS. 6D and 6E show other embodiments of coplanar, intersecting elements. In FIG. 6D, finger 610 is shorter in height than 620 but is positioned within the cross-sectional height of finger 620. Fingers 610 and 620 have bottom surfaces 612 and 622, respectively, that are aligned in this embodiment, such as to provide an even surface for mounting to a semiconductor surface. In the embodiment of FIG. 6E, finger 610 has a larger height than finger 620 and extends beyond the top surface of finger 620. A majority of the cross-sectional area of finger 610 overlaps the entire cross-section of finger 620, and therefore fingers 610 and 620 are coplanar as defined in this disclosure.

Figure 6F:
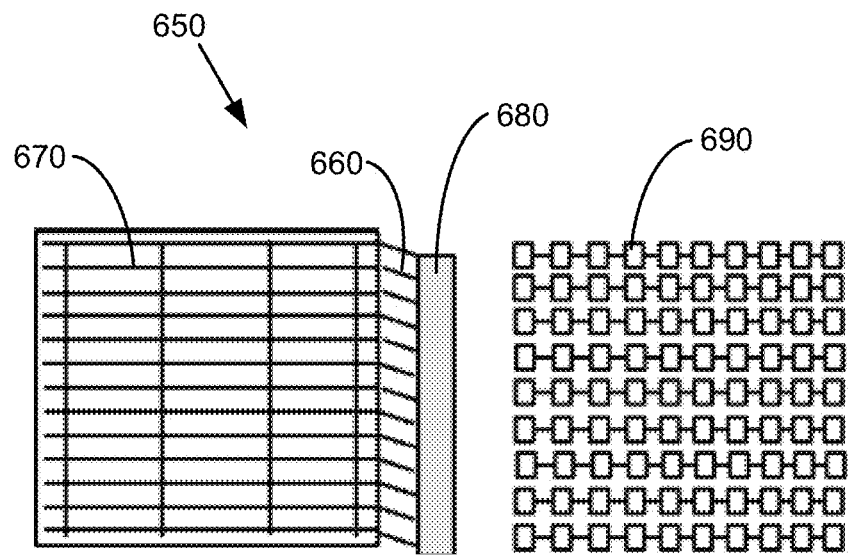
FIGS. 6F-6G are top views of yet further embodiments of metallic articles.
Figure 6G:
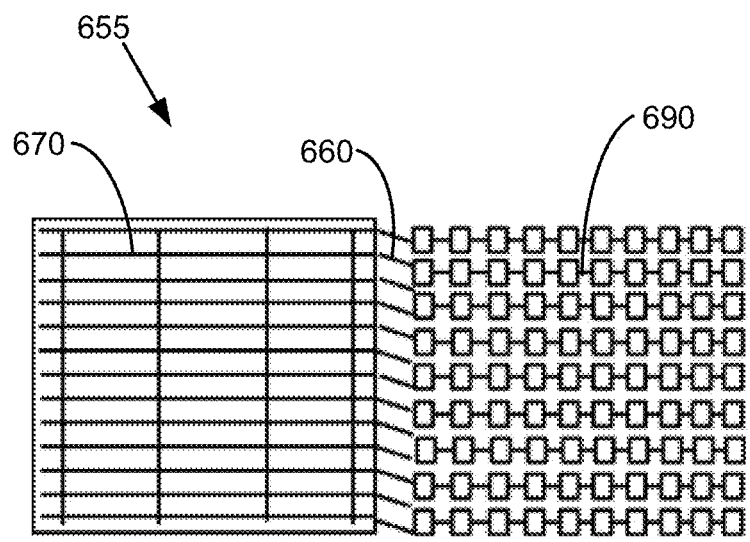

FIGS. 6F and 6G show yet other embodiments, in which electroformed metallic articles enable interconnections between photovoltaic cells in a module. A typical module has many cells, such as between 36-60, connected in series. The connections are made by attaching the front of one cell to the back of the next cell using solder-coated copper ribbon. Attaching the ribbon in this way requires a ribbon that is thin, and consequently resistive, so that the ribbon can bend around the cells without break the cell edges. The interconnections also typically require three separate ribbons, each soldered separately. In the embodiment of FIG. 6F, a metallic article 650 has interconnection elements 660 that have been integrally electroformed with a first grid region 670. Interconnection elements 660 have a first end coupled to grid 670, and are configured to extend beyond the surface of a photovoltaic cell to allow connection to a neighboring cell. The interconnection elements 660 replace the need for a separate ribbon to be soldered between cells, thus reducing manufacturing costs and enabling possible automation. In the embodiment shown, interconnection elements 660 are linear segments, although other configurations are possible. Also, the number of interconnection elements 660 can vary as desired, such as providing multiple elements 660 to reduce resistance. Interconnection elements 660 may be bent or angled after electroforming, such as to enable a front-to-back connection between cells, or may be fabricated in the mandrel to be angled relative to the grid 670.

The opposite end of interconnection elements 660 may be coupled to a second region 680, where the second region 680 may also be electroformed in an electrically conductive mandrel as part of the metallic article 650. In FIG. 6F, the second region 680 is configured as a tab—e.g., a bus bar—that may then be electrically connected to an electrical conduit 690 of a neighboring cell. The conduit 690 is configured here as a mesh, but other configurations are possible. Grid 670 may, for example, serve as an electrical conduit on a front surface of a first cell, while grid 690 may be an electrical conduit on a rear surface of a second cell. In the embodiment of FIG. 6G, a metallic article 655 has a mesh instead of a bus bar type of connection. Metallic article 655 includes first region 670, interconnection elements 660 and second region 690 that have all been electroformed as a single component, such that the inter-cell connections are already provided by metallic article 655. Thus the metallic articles 650 and 655 provide electrical conduits not only on a surface of one photovoltaic cell, but also the interconnections between cells.

Figure 17:
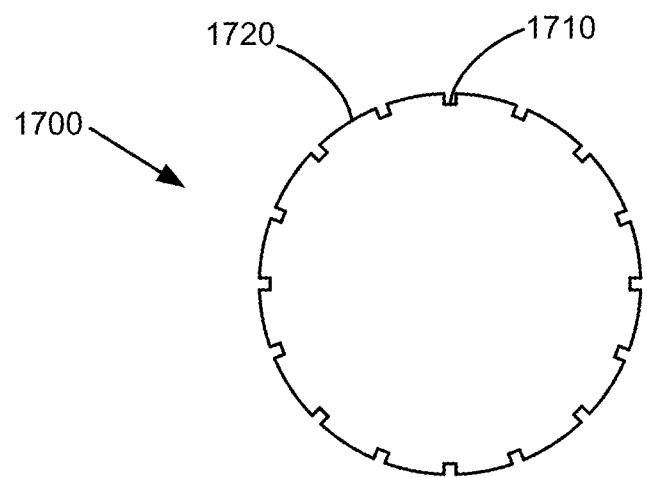
FIG. 17 is a cross-sectional view of an exemplary cylindrical mandrel.
Figure 18:
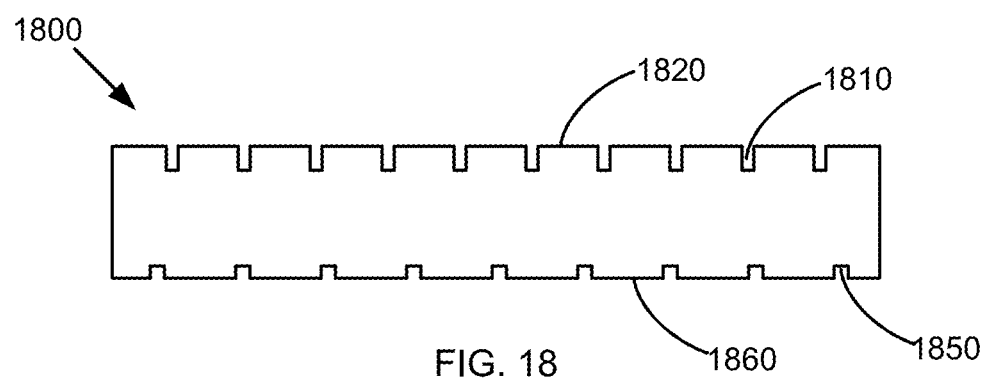
FIG. 18 shows a cross-sectional view of an embodiment of a flat mandrel having patterns on its top and bottom surfaces.

Although the mandrels described in FIGS. 2-5 have been described as flat mandrels, the mandrel may instead be cylindrical to be conducive to a continuous process. FIG. 17 shows a cross-sectional view of an exemplary cylindrical mandrel 1700, with preformed pattern 1710 created on outer surface 1720. In such embodiments, the cylindrical mandrel 1700 may be dipped and rotated in an electroforming bath, and the resulting unitary metallic article may be produced as a continuous strip that can later be trimmed to into separate, unitary pieces as needed. In other embodiments, a flat mandrel 1800, exemplified in the cross-sectional view of FIG. 18, may have a first preformed pattern 1810 in a top surface 1820 and a second preformed pattern 1850 in a bottom surface 1860. The first and second preformed patterns 1810 and 1850 may be the same or different from each other. For example, in FIG. 18 the first preformed pattern 1810 has elements with different width, height and pitch than the second preformed pattern 1850. The two-sided mandrel 1800 may be used to produce the two patterns at once, or in other embodiments, one side may be masked while the other side is used to produce an electroformed part. In one embodiment, the first preformed pattern may be used to produce a metallic article for the front side of a solar cell, and the second preformed pattern may be used to form a metallic article for the back side of the solar cell.

Figure 7:
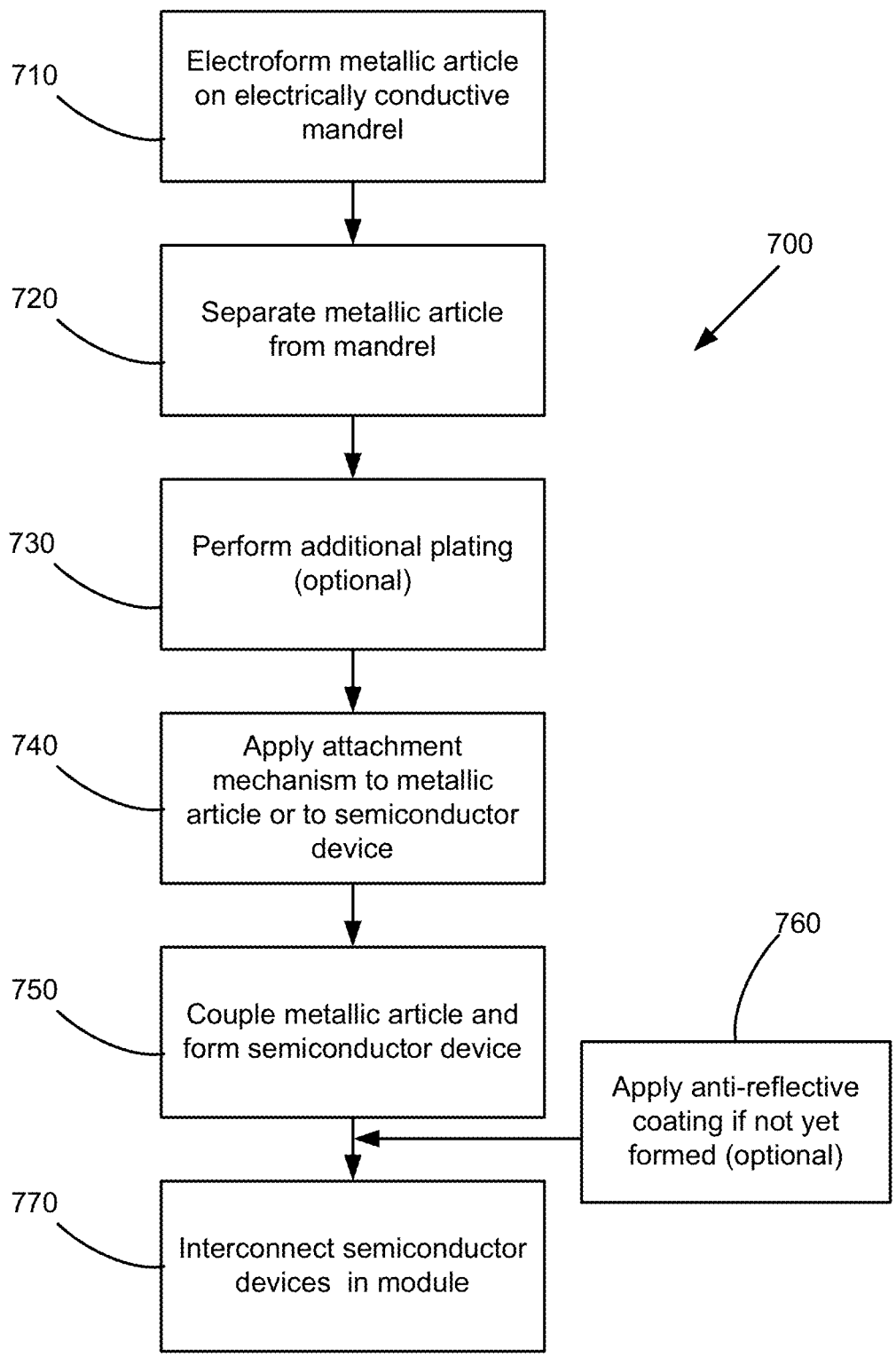
FIG. 7 is an exemplary flow chart of a process for manufacturing an electroformed article and forming a semiconductor device such as a solar cell.

FIG. 7 depicts an exemplary flow chart 700 for fabricating a free-standing electroformed metallic article for use with a semiconductor assembly such as a photovoltaic cell. In this disclosure, reference to semiconductor materials in formation of a semiconductor device or photovoltaic cell may include amorphous silicon, crystalline silicon or any other semiconductor material suitable for use in a photovoltaic cell. In a step 710, an electroforming process is performed using an electrically conductive mandrel. The mandrel has one or more preformed patterns in which to form a metallic article. In some embodiments, the metallic article is configured to serve as an electrical conduit within a photovoltaic cell. In certain embodiments, the metallic article may include features to enable connections between photovoltaic cells of a solar module. The preformed pattern may have an aspect ratio of greater than 1, and may include multiple parallel patterns intersecting each other. At least a portion of the finished electroformed metallic article is created within the preformed patterns. Other portions of the metallic article, such as a bus bar, may be formed within preformed patterns or on a top surface of the mandrel.

The electroforming step 710 may include contacting the outer surface of the mandrel with a solution comprising a salt of a first metal, where the first metal may be, for example copper or nickel. The first metal may form the entire metallic article, or may form a metallic precursor for layers of other metals. For example, a solution of a salt comprising a second metal may be plated over the first metal. In some embodiments, the first metal may be nickel and the second metal may be copper, where the nickel provides a barrier for copper diffusion. A third metal may optionally be plated over the second metal, such as the third metal being nickel over a second metal of copper, which has been plated over a first metal of nickel. In this three-layer structure, the copper conduit is encapsulated by nickel to provide a barrier against copper contamination into a semiconductor device. Electroforming process parameters in step 710 may be, for example, currents ranging from 1 to 3000 amps per square foot (ASF) and plating times ranging from, for example, 1 minute to 200 minutes. Other electrically conductive metals may be applied to promote adhesion, promote wettability, serve as a diffusion barrier, or to improve electrical contact, such as tin, tin alloys, indium, indium alloys, bismuth alloys, nickel tungstate, or cobalt nickel tungstate.

After the metallic article is formed, the metallic article is separated in step 720 from the electrically conductive mandrel to become a free-standing, unitary piece. The separation may involve lifting or peeling the article from the mandrel, with or without the use of a temporary polymeric sheet, or with or without the use of vacuum handling. In other embodiments, removal may include thermal or mechanical shock or ultrasonic energy to assist in releasing the fabricated part from the mandrel. The free-standing metallic article is then ready to be formed into a photovoltaic cell or other semiconductor device, by attaching and electrically coupling the article as shall be described below. Transferring of the metallic article to the various manufacturing steps may be done without need for a supporting element, such as a plastic or polymeric substrate, which can reduce cost.

The free-standing metallic article may be mounted directly to a solar cell or may undergo additional processing steps prior to being attached. Note that for the purposes of this disclosure, the term "metallic article" may also be interchangeably referred to as a grid or mesh, even though some embodiments may not include intersecting cross-members. If the metallic article has been formed without a barrier layer, the separated, free-standing metallic article may optionally undergo additional plating operations in step 730. For example, nickel plating may be performed by, for example, electroless or electroplating. In some embodiments, the metallic article may also be plated with nickel-cobalt-tungsten or cobalt-tungsten-phosphorous to create a diffusion barrier for copper material at high temperatures, while the standard nickel plating prevents copper migration in the cell below 300° C.

After any additional plating has been completed, in step 740 an attachment mechanism may be applied to the free-standing metallic article to prepare it for being mounted to a cell surface. For a standard solar cell model, a reactive metal layer such as a fire-through silver paste may be applied to the surface of the metallic article that is to be coupled to the solar cell. The reactive paste provides the electrical connection between the metallic article and the semiconductor layer, and may be thinly applied. The paste may be applied to the electroformed metallic article by, for example, screen printing. The amount of silver that is applied to the grid is much less than that which is required when forming the metallization layer solely from fire-through paste. Because the fire-through paste is applied onto the grid rather than the solar cell, the electrical coupling between the grid and solar cell is self-aligned. That is, there is no need to align the fingers of the electrical conduit to conductive lines of paste that have been applied onto the solar cell, thus simplifying the manufacturing process. Furthermore, in conventional methods, extra paste is often applied to ensure alignment with electrical contacts. In contrast, the present methods enable the application of silver paste only where necessary. Additional methods of applying the attachment mechanism include electroplating; electroless plating; wave soldering; physical vapor deposition techniques such as evaporation or sputtering; dispensing via ink jet or pneumatic dispensing techniques; or thin film transfer techniques such as stamping the grid onto a thin film of molten solder or metal.

While some types of solar cells use dielectric ARC's, other types use conductive ARC's, such as TCO's. For TCO types of solar cells, such as those coated with indium-tin-oxide (ITO), the attachment mechanism in step 740 may be solder, such as a low temperature solder. The solder is applied to the surface of the grid that will be in contact with the cell. By applying solder to the grid, a minimal amount of solder is used, thus reducing material cost. In addition, the solder is self-aligned with the grid pattern. The type of solder on the metallic article may be chosen for characteristics such as good ohmic contact and electrical conductivity, strong adhesion, rapid thermal dissipation, low coefficient of thermal expansion (CTE) mismatch with the targeted surface, robust mechanical stress relief, high mechanical strength, solid electrical migration barrier, adequate wettability, and chemically sound material inter-diffusion barriers between the metallic electroformed grid and the surface of the solar cell. In one embodiment, a no-clean solder may be applied. In another embodiment, an electroless or electroplated low melting point metal or alloy—such as, but not limited to, indium, indium-tin, indium-bismuth, lead-tin-silver-copper, lead-tin-silver, and lead-indium—may be applied to the grid. In a further embodiment, a solder paste may be printed onto the grid. The solder paste may require a drying process before the grid and the solar cell can be coupled together. In yet another embodiment, the tips—that is, the bottom surface—of the grid may be dipped or immersed into a liquid solder, which will selectively attach to the mesh surface.

Although the attachment mechanisms above have been described as being applied to the electroformed article, in other embodiments, step 740 may include applying the fire-through paste or solder material to the solar cell. The electroformed article would then be brought into contact with the conductive patterns made by the paste or solder. The metallic article may be prepared for contacting with the cell by optionally applying an indium metal or indium alloy to the article. The indium can be electroplated onto the surface of the grid by dipping the grid into the electrolyte while providing current. In another embodiment, the grid may be coated by an electroless plating method by dipping it into a solution of indium. The grid can be dipped first into a molten flux, which removes oxide on the tips of the grid, and then into an indium tin solder such that only the tips of the grid are wetted with the indium tin solder. In another embodiment, the grid can be dipped into indium tin paste followed by an anneal step, again with only the tips of the grid being coated. Coating of only the tip, and not the entire grid, with indium preserves precious indium while still achieving a contactable surface. Once indium-tipped, the fingers or elements of the electroformed article may then be aligned with the fire-through paste or solder on the cell by, for example, optical alignment marks on edges of the solar cell.

In further embodiments, the metallic articles may be utilized in back-contact types of solar cells, such as those illustrated in FIG. 1B, using similar methods. An attachment mechanism, which would typically be solder, is applied to either the metallic article or the solar cell in step 740, and the metallic article is then contacted with the cell. The attachment mechanism is heated to electrically couple the metallic article with the cell. In one embodiment of back-contact solar cells, the electroformed elements of a first metallic article would be coupled to the p-type regions on the rear surface of the cell, while the electroformed elements of a second metallic article would be coupled to the n-type regions. For example, the metallic articles could be configured with linear fingers, as in FIG. 6A, and the fingers of the first metallic article would be interdigitated with the fingers of the second metallic article.

After an attachment mechanism has been applied to the metallic article, the metallic article is coupled to the cell or semiconductor device surface in step 750. The metallic article is brought into contact with the surface of the solar cell. If the grid article has been tipped with fire-through silver paste, the assembly is heated to the fire-through temperature of the paste, such as to temperatures of at least 400° C., or at least 800° C. The grid may be held mechanically stable during firing by the use of rollers or clamps. Once the fire-through paste is set, neighboring solar cells in a module may be interconnected. For solder-tipped grids, the grid is similarly coupled to the solar cell and heated to temperatures required for the particular solder typically ranging between 100° C. and 300° C. A thermal and/or pressure process in atmosphere or vacuum may be used to reflow the solder and form the contacts between the metallic article and the solar cell.

In some embodiments, the independent grid or metallic article, after being plated with the desired barrier layers, can be attached to a solar cell prior to anti-reflective coating layer deposition. In a standard cell, the grid can be contacted to the emitter surface (e.g., doped silicon) and heated to create a nickel silicide chemical bond. The ARC, such as a nitride, can then be deposited after grid attachment, in optional step 760. A bus bar of the grid can then be connected to another cell in the module. This embodiment of attaching the grid before the ARC layer eliminates the need for any silver fire-through usage. In addition, this embodiment may be applied to silicon heterojunction solar cells. For instance, the free-standing metallic article, such as a grid, can be coupled to the surface of the heterojunction cell amorphous silicon layer. It can then be heated to create a nickel silicide bond, and the ITO layer can be deposited on the grid afterwards.

After the completed photovoltaic cell has been formed in step 750, the multiple cells that form a solar module may be interconnected in step 770. In some embodiments, the bus bars or tabs that have been electroformed as part of the metallic article may be utilized for these interconnections.

It can be seen that the free-standing electroformed metallic article described herein is applicable to various cell types and may be inserted at different points within the manufacturing sequence of a solar cell. Furthermore, the electroformed electrical conduits may be utilized on either the front surface or rear surface of a solar cell, or both. When electroformed articles are used on both front and back surfaces, they may be applied simultaneously to avoid any thermal expansion mismatch which may cause mechanical bending of the cells.

Figure 8A:
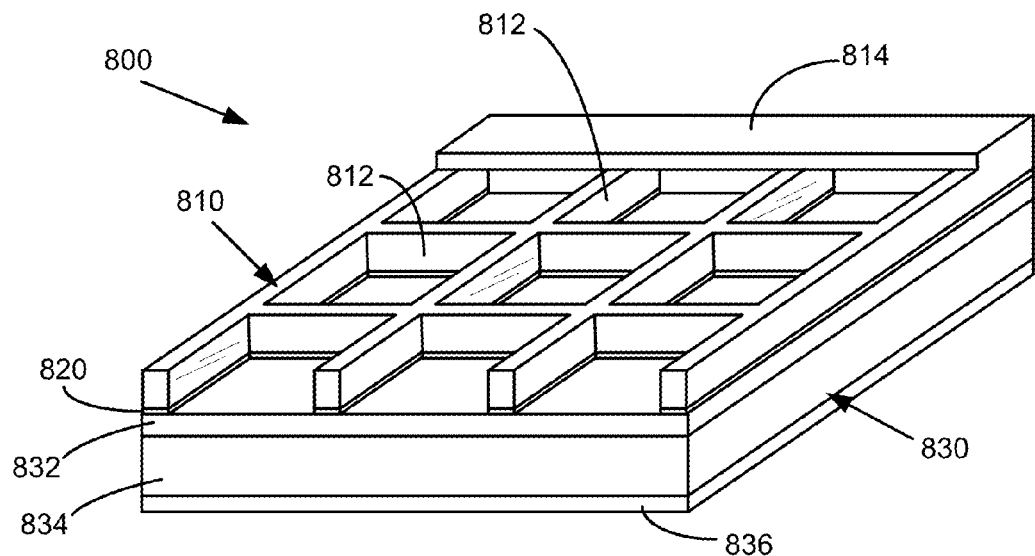
FIGS. 8A-8B are perspective views of exemplary solar cells fabricated with a free-standing metallic article.
Figure 8B:
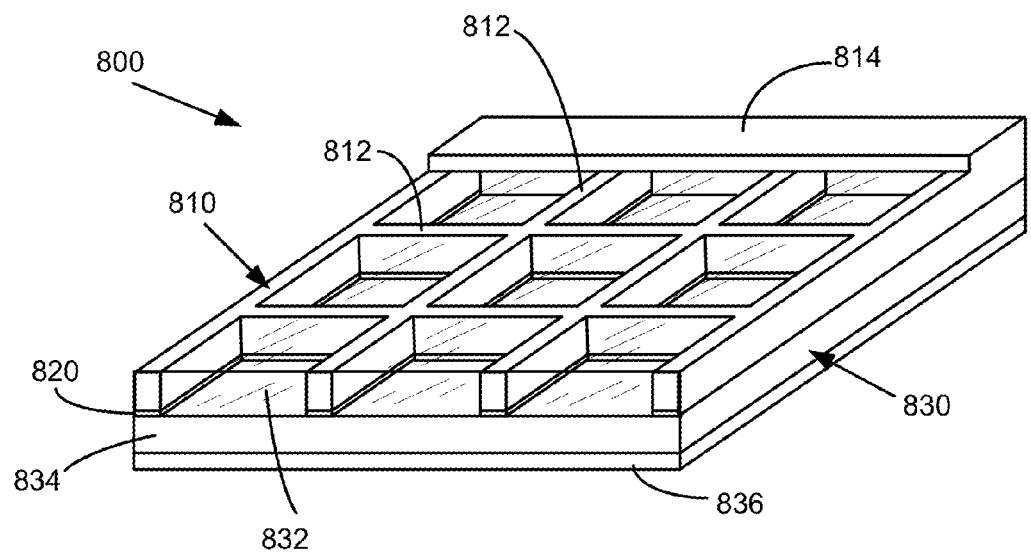

FIGS. 8A-8B illustrate a schematic of an exemplary photovoltaic cell 800 produced with a free-standing metallic article 810. Metallic article 810 in this embodiment includes electroformed elements 812 and a frame element 814 that spans an edge near the perimeter of the electroformed elements 812. Electroformed elements 812 are shown as parallel lines that intersect perpendicularly in this embodiment to form a continuous grid pattern, but in other embodiments they may be configured with lines intersecting at other angles, or as one set of parallel lines, or as other patterns. The tips of electroformed elements 812 have an attachment material 820, such as solder or fire-through silver paste, applied to them. The attachment material 820 electrically couples the metallic article 810 to a photovoltaic component 830, where the photovoltaic component 830 may include light incident layer 832 (e.g., ARC and/or TCO), active region 834 (emitter and base), and rear contact layer 836. FIG. 8B shows another embodiment of a photovoltaic cell 800 in which layer 832 is an ARC, in which the attachment material 820 is a silver paste that has been fired through the ARC. In FIGS. 8A-8B, an encapsulant (not shown) may be applied over metallic article 810 to seal the completed photovoltaic cell 800, with interconnection with other cells being made with the frame element 814. In other embodiments, a second metallic article 810 may be similarly coupled to rear contact layer 836, which is a non-incident light surface, to provide an electrical contact of opposite polarity for the photovoltaic cell 800.

Figure 8C:
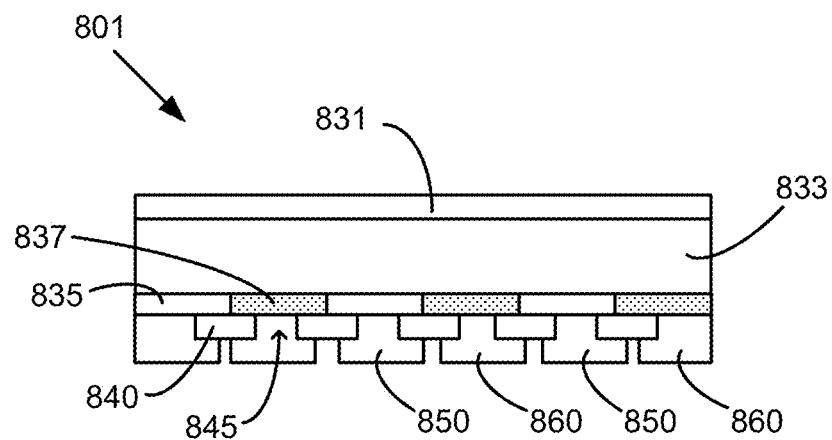
FIG. 8C is a cross-sectional view of another embodiment of a solar cell.
Figure 8D:
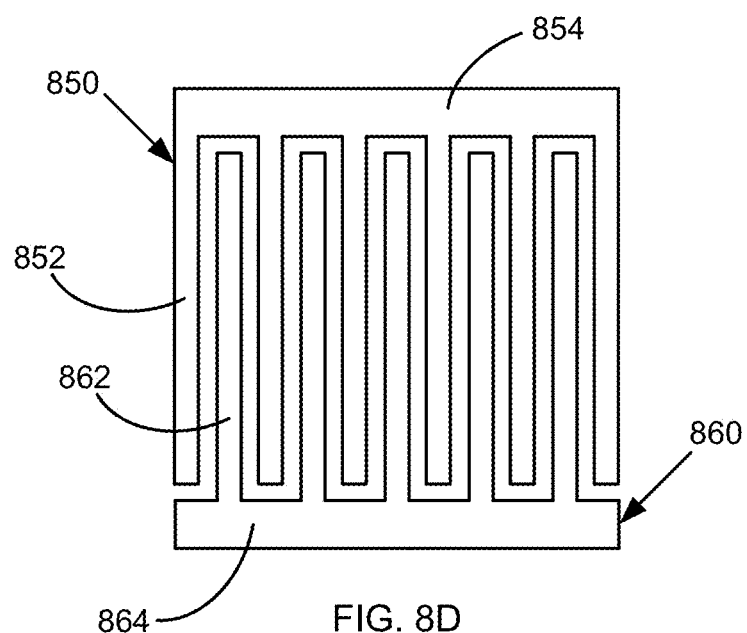
FIG. 8D is a top view of exemplary metallic articles used in the solar cell of FIG. 8C.

FIGS. 8C-8D show simplified schematics of an exemplary back-contact solar cell 801 produced with free-standing metallic articles. In the cross-sectional view of FIG. 8C, solar cell 801 includes transparent layer 831 (e.g., an ARC), semiconductor substrate 833, doped regions 835 and 837, and passivating layer 840. Two free-standing metallic articles 850 and 860 have electroformed elements that are positioned in an alternating fashion. The electroformed elements of metallic articles 850 and 860 provide electrical contact with doped regions 835 and 837, respectively, through the holes 845 in passivating layer 840. FIG. 8D shows a top view of metallic articles 850 and 860 used in solar cell 801. Metallic article 850 has fingers 852 that are interdigitated with fingers 862 of metallic article 860. Frame elements 854 of metallic article 850 and frame element 864 of metallic article 860 serve as an electrical connection point for each metallic article, and also provide mechanical stability.

Figure 9A:
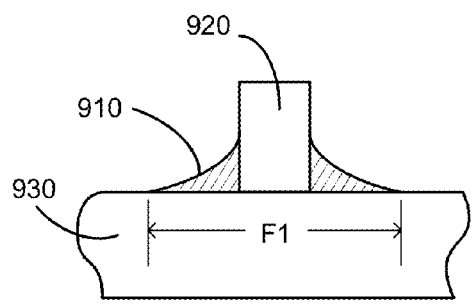
FIGS. 9A-9B illustrate an embodiment of tailoring features of an electroformed element.
Figure 9B:
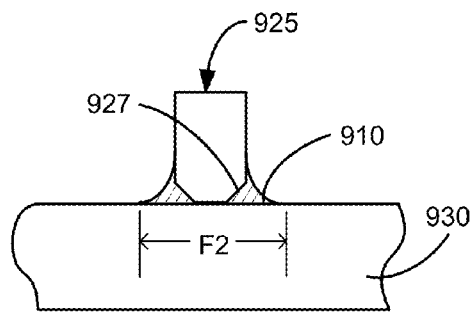

FIGS. 9A-9B illustrate yet another embodiment in which the shading impact of solder applied between the metallic article and solar cell can be reduced. FIG. 9A shows a vertical cross-sectional view of a standard solder joint 910 that may result from soldering a metal element 920, having a rectilinear cross-section, to a solar cell 930. Because solder naturally forms a wetting angle between the surfaces that it is joining, the solder has a footprint with a width 'F1'. The width of this footprint will block light from entering the solar cell 930, and thus causes shading. In FIG. 9B, the cross-sectional shape of electroformed element 925 has been altered compared to electroformed element 920, in that electroformed element 925 has chamfered corners 927 on its lower surface. The chamfering changes the wetting angle of the solder joint 910, such that the footprint width 'F2' is less than 'F1'. Thus, the tailored shape of electroformed element 925 reduces shading. The ability to customize the cross-sectional shape of electroformed element 925 is made possible by the use of an electroforming mandrel, as described in the various embodiments above. Features such as chamfering, filleting, dimples, nubs, and the like may be formed in the mandrel to impart these features to the electroformed part that is to be produced.

Figure 10A:
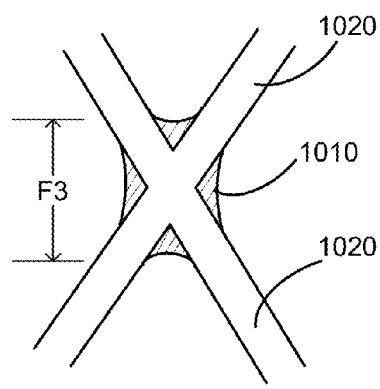
FIGS. 10A-10B illustrate another embodiment of tailoring features of an electroformed element.
Figure 10B:
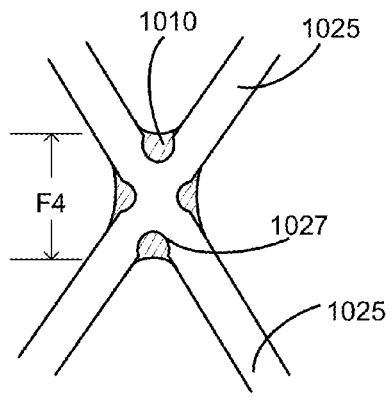

FIGS. 10A-10B show top views of another embodiment of reducing the shading impact from solder applied to a metallic article. FIG. 10A shows a conventional solder joint 1010 applied to two obliquely intersecting linear segments 1020. The total footprint of the solder joint 1010 has a width 'F3'. FIG. 10B shows electroformed elements 1025 where concave cut-out features 1027 have been incorporated into the corners where the electroformed elements 1025 intersect, through features of the mandrel in which the elements 1025 have been formed. The concave features 1027 changes the wetting angle of the solder 1010, such that the footprint width 'F4' is reduced compared to 'F3'. Shapes other than the concave features shown here are possible. Thus, the ability to tailor the shape of the electroformed elements, by incorporating features into a forming mandrel, can reduce the shading impact of the solder that is used to couple the electroformed elements to a photovoltaic surface.

Figure 11A:
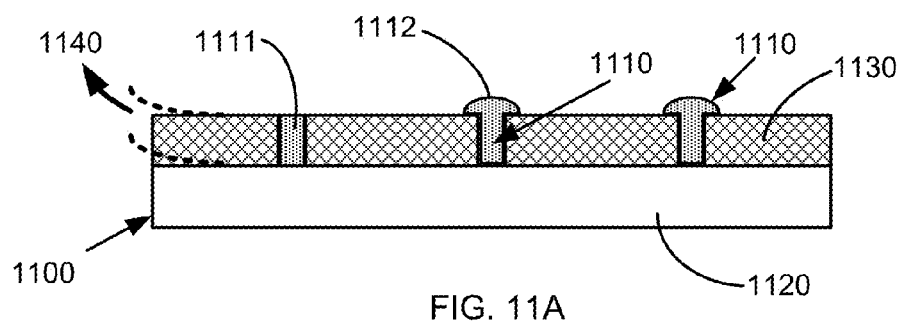
FIGS. 11A-11C are cross-sectional views of stages of forming a metallic article with a dielectric transfer layer, in one embodiment.
Figure 11B:
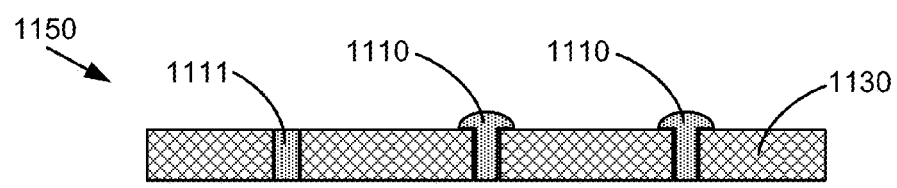
Figure 11C:
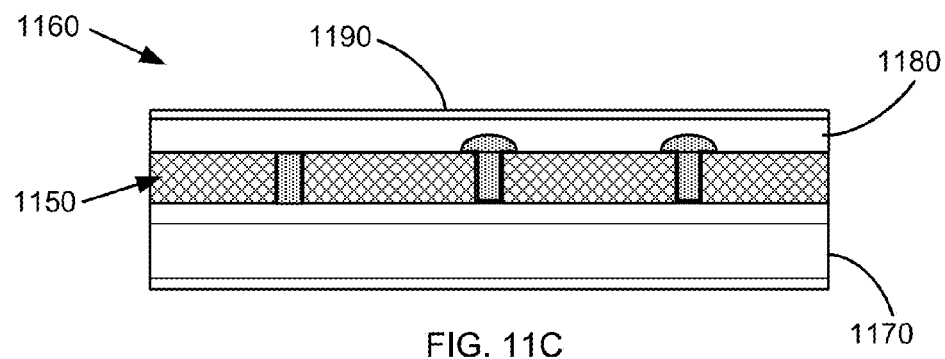

In another embodiment shown in FIGS. 11A-11C, a portion of the mandrel in which the metallic article is formed may become part of a final semiconductor device. FIG. 11A shows a cross-sectional view of a mandrel 1100 similar to previously described mandrel 400 of FIG. 4, having a metal base 1120 and a dielectric layer 1130 with patterns for forming electroformed elements 1110. Electroformed elements 1110 have been formed in dielectric layer 1130 during the electroforming process. In addition, the plating thickness may also exceed the height of the mandrel patterns to form overplated heads 1112. In other embodiments, no overplating is performed, as in electroformed elements 1111. When removing the metallic article comprising electroformed elements 1130 from the mandrel 1100, dielectric layer 1130 may be peeled off, along with the electroformed elements 1130, from mandrel metal base 1120 as indicated by arrow 1140. The heads 1112 may help secure the electroformed elements 1110 to the dielectric layer 1130.

In FIG. 11B the separated metallic article 1150, which is a combination of electroformed elements 1110 and is surrounded by the dielectric layer 1130, may then be coupled to a semiconductor surface to form, for example, a photovoltaic cell. One embodiment of a solar cell 1160 is depicted in the simplified schematic of FIG. 11C. Solar cell 1160 includes a semiconductor assembly 1170. Metallic article 1150 is coupled to semiconductor assembly 1170, and is overlaid by an encapsulant 1180 and a window layer 1190 such as an anti-reflective coating. Encapsulant 1180 may be, for example, ethylene vinyl acetate (EVA), thermoplastic polyolefin (TPO) or polyvinyl butyral (PVB). The dielectric layer 1130 of FIGS. 11A-11C can be chosen to be suitable for the appropriate semiconductor application. For a photovoltaic cell, the target characteristics of the transferable dielectric will depend on the reliability specifications of the intended solar module. Because the dielectric will be incorporated into the module, it must have a durability to withstand the lifetime of a solar module. The dielectric must also be transparent to allow light to be transmitted to the solar cell, and should also be resistant to copper diffusion into the cell. One type of suitable dielectric is, for example solder resistant dielectrics that are known in the electronic packaging industry.

Figure 12:
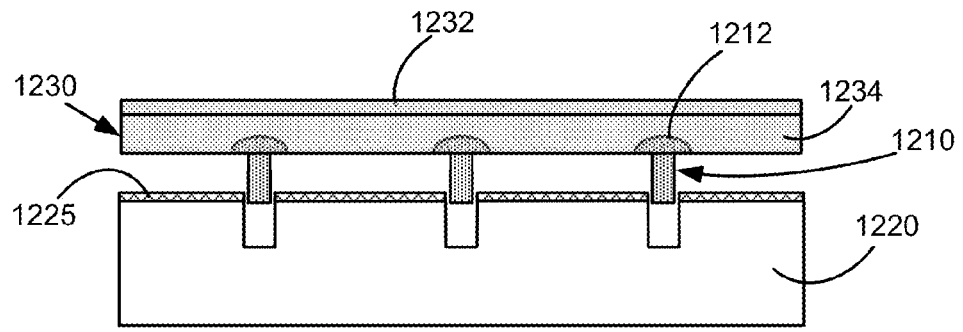
FIG. 12 depicts a cross-sectional view of an embodiment of a metallic article being removed using a polymer sheet.

In other embodiments, the metallic article described herein may be combined with a polymer sheet to form a polymer layer. FIG. 12 shows one embodiment of such a method, in which a metallic article having electroformed elements 1210 has been formed with a mandrel 1220. Electroformed elements 1210 may be configured, for example, as a set of parallel lines, or sets of intersecting lines forming a grid. For this embodiment, electroformed elements 1210 have been overplated to form a rounded head 1212 at their top surface, as has been described above in relation to electroformed element 312 of FIG. 3B. A polymer sheet 1230 is placed over the surface of the mandrel and is used to remove the electroformed elements 1210 from the mandrel 1220. FIG. 12 shows a state in which the polymer sheet 1230 and electroformed elements 1210 have been lifted from the mandrel 1220. The polymer sheet 1230 is contacted to the mandrel such that the heads 1212 of electroformed elements 1210 are at least partially embedded into the polymer sheet 1230. The heads 1212 enable the polymer sheet 1230 to grip the electroformed elements 1210 because of the larger surface area, and the heads 1212 also may serve as anchor points. Note that although the heads 1212 are embodied with curved surfaces, other shapes are possible. In addition, for some metallic articles and mandrels, overplating may not be needed. The polymer sheet 1230 with the embedded heads 1212 of electroformed elements 1210 is lifted from the mandrel 1220, which pulls the heads 1212 upward, which in turn lifts the electroformed elements 1210 of the metallic article off the mandrel 1220. The bottom of the electroformed elements 1212 remains exposed from the polymer sheet 1230, hanging from these anchor points, which allows them to be subsequently coated or plated as needed.

The polymer sheet 1230 may be made of, for example, EVA, TPO or PVB. Polymer sheet 1230 may optionally be structured as a substrate layer 1232 covered by an adhesive layer 1234. The adhesive layer 1234 faces the mandrel, to engage the electroformed elements 1210. The substrate layer 1232 may be, for example, polyethyelene, polyester or polyester films (e.g., Mylar®) and the adhesive layer 1234 may be, for example, EVA or TPO. If the polymer sheet 1230 includes an adhesive, mandrel 1220 may include an optional release layer 1225 to allow the polymer sheet 1230 to be easily peeled from the mandrel 1220. Release layer 1225 may be, for example, a fluoropolymer, or other low-adhesion materials. The adhesive layer 1234 is made with a thickness to enable the heads 1212 to be at least partially embedded in it.

In some embodiments, the polymer sheet 1230 is used primarily to remove the electroformed elements 1212 from the mandrel, such as to serve as a transfer material. The polymer sheet 1230 can then be separated from the electroformed elements 1212, resulting in a free-standing metallic article as has been described in previous embodiments. Using a polymer sheet to remove the metallic article from the electrically conductive mandrel can make the processing conducive to automation, which enables high throughputs. The polymer sheet can also provide support for the electroformed metallic article while the article undergoes additional manufacturing steps. For example, because the bottom surfaces of the electroformed elements 1210 remain exposed after being extracted from mandrel 1220, the polymer sheet 1230 may be used to hold the metallic article while the bottom surfaces are, for example, plated with barrier layers or applied with solder or fire-through paste. The polymer sheet 1230 may also provide additional mechanical support to preserve the dimensions of the grid during handling.

Figure 13A:
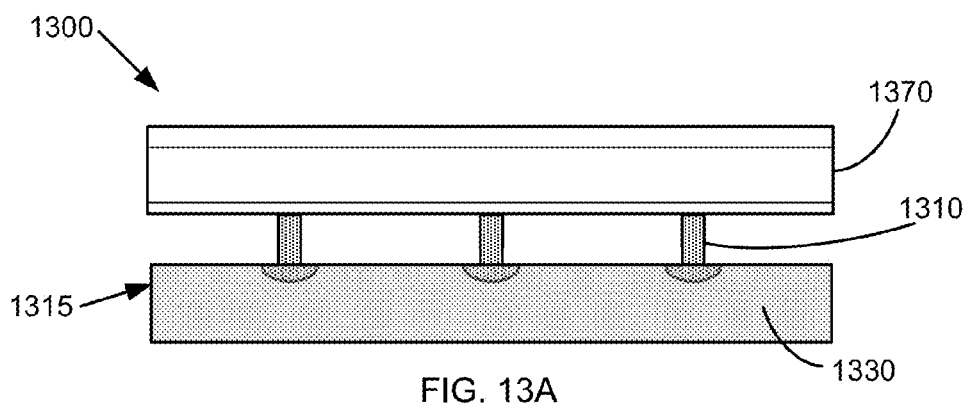
FIGS. 13A-13B are cross-sectional views of an exemplary polymer layer being fabricated into a back-contact solar cell.
Figure 13B:
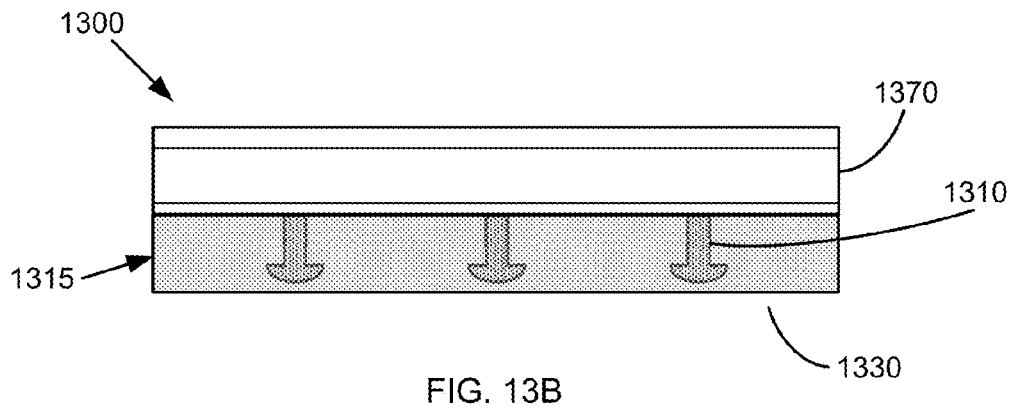

In other embodiments, the polymer sheet may become a component in a final semiconductor device in which the metallic article is to be placed. FIGS. 13A-B show an exemplary embodiment, in which a polymer layer 1315 is placed on a semiconductor component 1370 to form a photovoltaic cell 1300. In this embodiment, the polymer layer 1315 serves as an electrical conduit for the rear surface of the photovoltaic cell 1300. However, the process described for FIGS. 13A-B may also be utilized for the polymer layer 1315 serving as a front contact, or both front and rear. Polymer layer 1315 includes polymer sheet 1330 and electroformed elements 1310, which are similar to polymer sheet 1230 and electroformed elements 1210 of FIG. 12. The semiconductor component 1370 may be, for example, a solar cell with layers such as an active region, rear contact, and TCO layers. In some embodiments, the polymer layer 1315 may have a reactive metal layer (not shown) applied to the exposed surface of electroformed elements 1310, or the reactive metal layer may be applied to the surface of semiconductor component 1370 that is receiving the electroformed elements 1310. The polymer layer 1315 is mechanically and electrically coupled to the cell 1370 using heat and pressure. The applied heat and pressure pushes the grid into the polymer material 1330, as shown in FIG. 13B. The electroformed elements 1310 create mechanical anchor points in the polymer 1330 and provide solid stabilization of the electroformed elements 1310 within polymer layer 1315. The polymer material 1330 is chosen to have the necessary characteristics of a solar encapsulant material, such as transparency, durability, wettability and corrosion resistance, among other constraints which may be necessary depending on the cell type. The material for polymer sheet 1330 may be, for example, EVA, TPO, PVB and ionomer.

Figure 14:
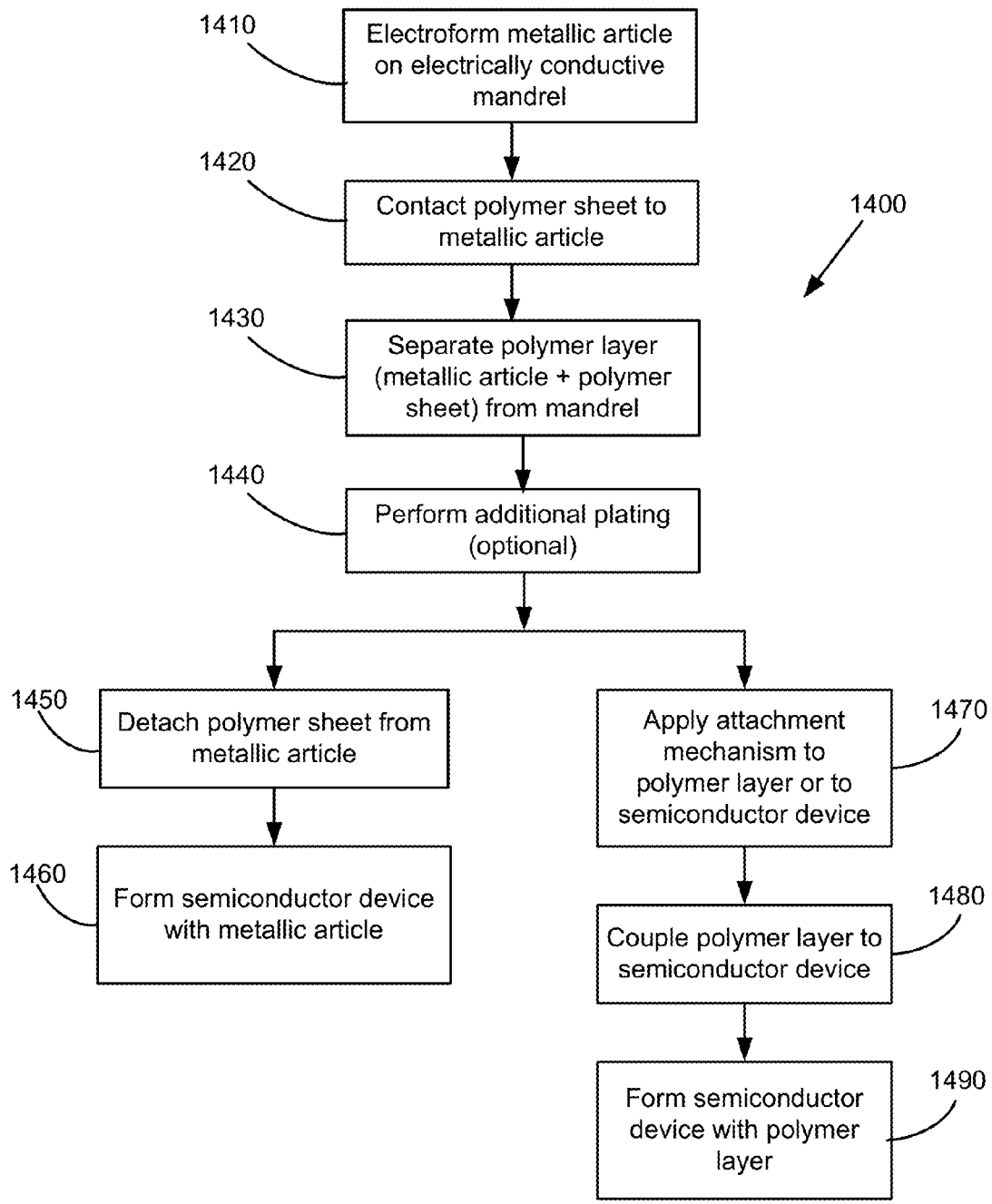
FIG. 14 shows an exemplary flow chart of a method of manufacturing a polymer layer with an electroformed article and forming a semiconductor device such as a solar cell.

FIG. 14 is an exemplary flow chart 1400 for using a polymeric substrate in combination with an electroformed metallic article, such as a grid or mesh. In step 1410, a metallic article is fabricated by an electroforming process using an electrically conductive mandrel with preformed patterns. The metallic article is contacted with a polymer sheet in step 1420, where a portion of the metallic article is embedded within the polymer sheet. In step 1430 the polymer sheet and electroformed elements are lifted or peeled from the mandrel to separate the polymer layer from the mandrel, where the polymer layer is a composite of the polymer sheet and the electroformed grid partially contained in it. In optional step 1440, additional plating or other processes can be performed on the exposed portions of the electroformed elements. For example, step 1440 may include plating nickel or another barrier material on the exposed portions of the grid, if nickel was not layered during the electroforming process. Step 1440 may also include cleaning steps, such as to remove oxides to prepare the grid for soldering.

If the polymer sheet is used primarily as a transfer material, the polymer sheet may be detached from the metallic article in step 1450. The metallic article can then be processed into a photovoltaic cell or other semiconductor device in step 1460, which may include performing steps 740 to 770 of FIG. 7. In other embodiments in which the polymer sheet is to be incorporated into the finished device, in step 1470 an attachment mechanism may be applied to either the grid or the semiconductor device, as has been described in step 740 of FIG. 7. The polymer layer is then coupled to the semiconductor device, such as by bonding using heat and pressure, in step 1480. This bonding process results in the polymer material encapsulating the electroformed grid, and also electrically couples any solder or fire-through paste between the grid and the solar cell. The bonding process may include subjecting the cell and polymer layer to a lamination process with vacuum, elevated temperature and pressure. Under the lamination conditions, solder reflows and forms an electrical contact between the cell and polymer-supported metal grid, while the polymer bonds to the cell surface and makes a robust mechanical contact. The photovoltaic cell may then be completed in step 1490 by performing any finishing steps, such as applying an antireflective layer and forming interconnections with other cells in a solar module. The process of flow chart 1400 is applicable for both front and backside connections, as well as to various types of solar cells including standard, non-standard TCO-coated, and back-contact (e.g., interdigitated back contact) cells.

Figure 15A:
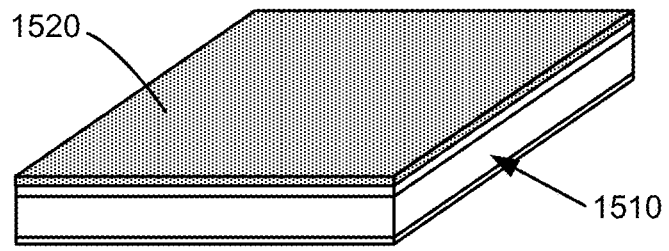
FIGS. 15A-15D provide perspective views of exemplary stages in using a metallic article as a mask for pattering a conductive layer on a semiconductor material.

In yet another embodiment, the metallic article disclosed herein may be used as a mask for a conductive layer on a semiconductor surface, wherein the metallic article is consequently self-aligned with the pattern produced on the conductive layer. FIG. 15A shows a perspective view of portion of a semiconductor device 1510, which includes layers for a solar cell. The semiconductor device 1510 has a conductive metal layer 1520 placed on its top surface. Conductive metal layer 1520, which may also be referred to in the industry as a contact layer, may substantially cover the full surface of semiconductor device 1510. The surface that is covered by conductive metal layer 1520 may be a light incident top surface of a solar cell. Conductive metal layer 1520 may be, for example a thin film of metal deposited onto a standard solar cell processed just prior to ARC layer deposition or through completion of a fired-through metal layer. Conductive layer 1520 may alternatively be a TCO layer. In one embodiment, conductive layer 1520 may be a thin layer of titanium with nickel deposited over it. The conductive metal layer 1520 is chosen to make good ohmic contact to the semiconductor device 1510, and provide excellent adhesion to the semiconductor device 1510 and to the metal grid that shall be subsequently attached. Conductive metal layer 1520 may be, for example, titanium, tungsten, chromium, molybdenum, or combinations thereof, and may be provided on the semiconductor device using any method known in the art, including deposition methods such as physical vapor deposition or electroplating. The thickness of conductive metal layer 1520, in some embodiments, can be only as thick as necessary to provide a uniform film that can maintain the required electrical and mechanical properties.

Figure 15B:
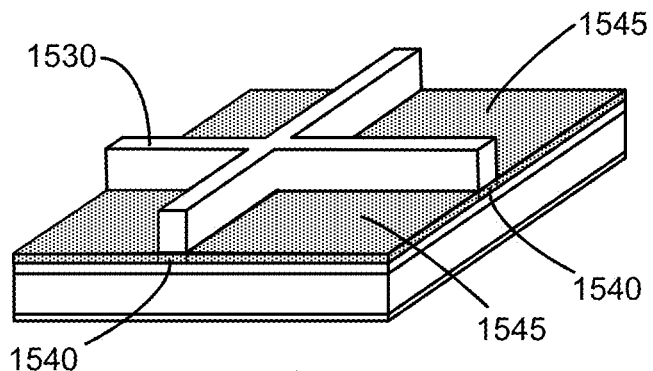

A metallic article, embodied as grid 1530 in FIG. 15B, can be mechanically and electrically coupled to the assembly comprising the semiconductor device 1510 and conductive metal layer 1520. This coupling (not shown) can be adhesion through the use of a solder paste, electrically conductive adhesive, or conventional solder such that the metal grid 1530 has good electrical and mechanical contact to the conductive metal layer 1520. The solder, solder paste, or adhesive may be applied to the grid 1530, such as to the bottom surface of grid 1530. This grid 1530 is designed such that it is highly conductive, yet provides a relatively low amount of shading over the cell. Grid 1530, for example, may have lines with a tall height to provide sufficient conductivity but a narrow width to minimize shading.

The metallic article attached to the conductive metal layer 1520 can be used as a mask to pattern the conductive metal layer 1520, so that the bulk of the solar cell area can be cleared for light absorption. For example, as shown, a masked region 1540 is formed directly beneath the grid 1530, while an exposed portion 1545 comprises the remaining portions of conductive metal layer 1520, where the grid 1530 is absent. The exposed portion 1545 can be removed such that conductive metal layer 1520 becomes patterned into the shape of the grid 1530. The conductive metal layer 1520 can be patterned by, for example, removing exposed portion 1545 with a wet chemical etch process, a dry etch process such as reactive ion etching, or by a physical etch process such as, but not limited to, ion milling. The etching process may remove all or a portion of the exposed region 1545.

Figure 15C:
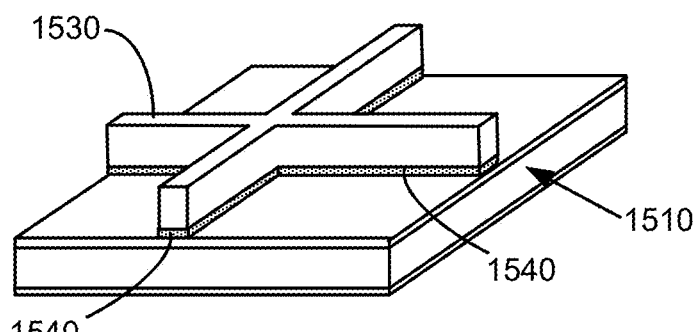
Figure 15D:
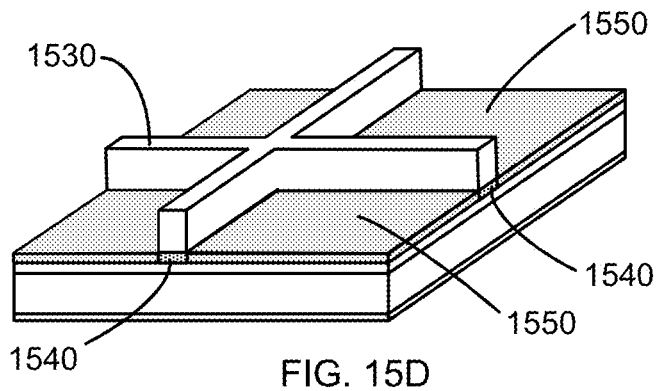

FIG. 15C shows the assembly after etching, such that only the masked region 1540 remains on the surface of semiconductor device 1510 in this embodiment. The masked region 1540 has a substantially similar pattern as grid 1530, and is coincident with grid 1530. Thus, the metal grid 1530 provides a chemically resistant mask in the case of wet or reactive ion etching, and a mechanical mask in the case of physical etching, allowing for the coupling and alignment of a separate metallic article to the semiconductor assembly. In FIG. 15D, a further embodiment is shown in which the semiconductor device 1510 is a standard cell, and in which the grid 1530 has been coupled to silicon instead of a TCO. After etching, a nitride layer 1550 has been deposited onto the areas that were previously occupied by the exposed portions of conductive metal layer 1520, to form an ARC layer for the photovoltaic cell. While not shown, metal grid 1530 may also be coated.

Figure 16:
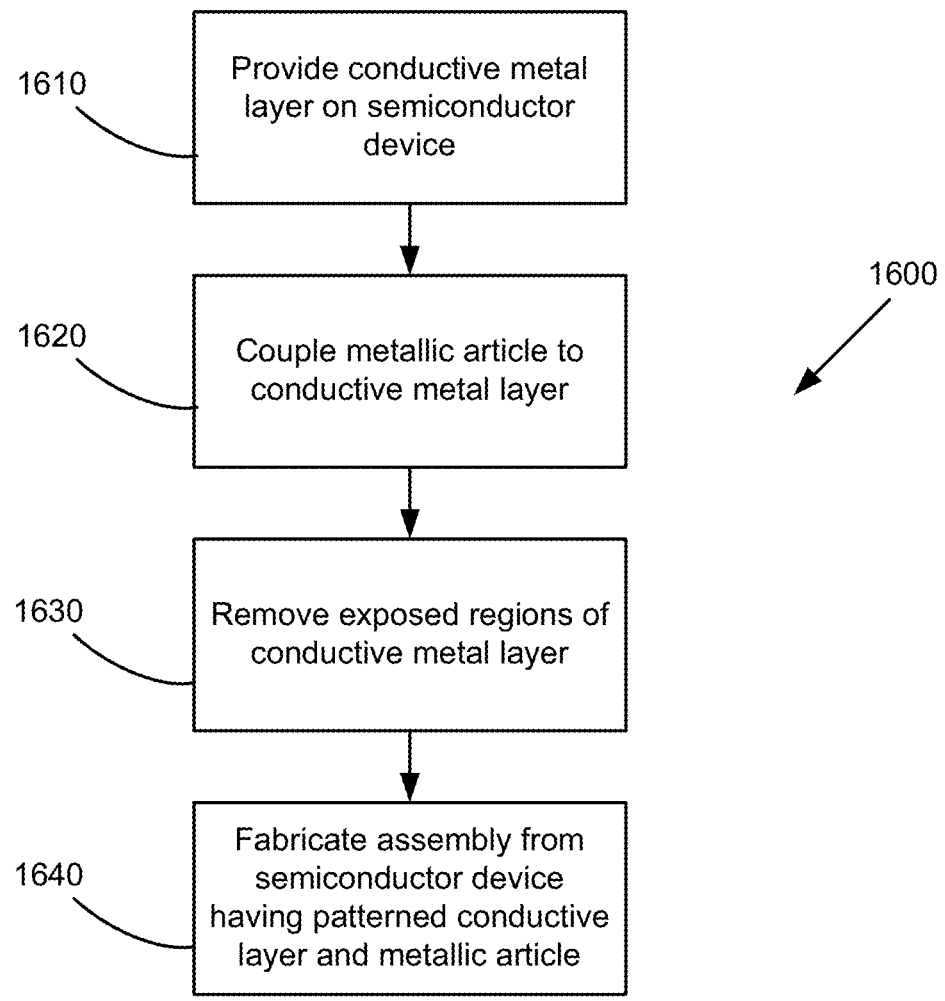
FIG. 16 is an exemplary flow chart of a method of using a metallic article as a mask for pattering a conductive layer on a semiconductor material.

FIG. 16 illustrates an exemplary flow chart 1600 for using a metallic article as a mask. In step 1610, a conductive metal layer is provided on a surface of a semiconductor material. In step 1620, a metallic article is electrically and mechanically coupled to the conductive metal layer. The metallic article may be electroformed in an electrically conductive mandrel having preformed patterns, as has been described above and shown, for example, in FIGS. 2-7. The portions of the surface of the semiconductor material that are covered by the metallic article are masked regions, and the uncovered portions are exposed regions. In step 1630, the exposed regions are partially or fully removed by, for example, one of various etching processes as has been described in relation to FIG. 15B-15C. The resulting assembly, with the conductive metal layer that is patterned and self-aligned with the metallic article, can now be processed further for fabrication into a finished semiconductor device assembly such as a solar cell. By using the grid as a mask, the total number of process steps is greatly reduced compared to conventional masking techniques in which a separate masking and patterning process must be undertaken in order to pattern the contact layer. Furthermore, the need for alignment between the metal grid and the conductive lines is eliminated since the mask is self-aligned with the patterned conductive lines that are produced. The metallic grid also provides an added level of robustness compared to conventional fired-through silver contacts.

Although the embodiments herein have primarily been described with respect to photovoltaic applications, the methods and devices may also be applied to other semiconductor applications such as redistribution layers (RDL's) or flex circuits. Furthermore, the flow chart steps may be performed in alternate sequences, and may include additional steps not shown.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method of forming an electrical component for a photovoltaic cell, the method comprising the steps of:
   i) electroforming a metallic article on an electrically conductive mandrel, wherein the electrically conductive mandrel has an outer surface comprising at least one preformed pattern, the preformed pattern comprising a continuous grid pattern coupled to a cell interconnection pattern,
   wherein the metallic article comprises a plurality of electroformed elements formed in the preformed pattern, the plurality of electroformed elements comprising a cell interconnection element coupled to a continuous grid having a plurality of first elements intersecting a plurality of second elements, and wherein the cell interconnection element is configured to directly couple the grid to a neighboring cell; and
   ii) separating the metallic article from the electrically conductive mandrel, wherein the plurality of electroformed elements are interconnected such that the metallic article forms a unitary, free-standing piece when separated from the electrically conductive mandrel;
   wherein the preformed pattern has a height and a width, wherein the ratio of the height to the width is an aspect ratio, and wherein the preformed pattern has an aspect ratio greater than 1; and
   wherein the plurality of electroformed elements are configured to serve as an electrical conduit for a light-incident surface of a photovoltaic cell.

2. The method of claim 1, wherein the aspect ratio is between about 1 and about 10.

3. The method of claim 1, wherein the step of electroforming comprises overplating the electroformed elements such that the electroformed elements extend above the outer surface of the electrically conductive mandrel.

4. The method of claim 1, wherein the step of electroforming the metallic article comprises contacting the outer surface of the mandrel with a first solution comprising a salt of a first metal, wherein a first metallic layer comprising the first metal is formed within the preformed pattern.

5. The method of claim 1, wherein the plurality of first elements and the plurality of second elements comprise a plurality of substantially parallel first elements intersecting a plurality of substantially parallel second elements, wherein the plurality of first elements and the plurality of second elements are coplanar such that one of the first elements has a first cross-section that overlaps a majority of a second cross-section of one of the second elements.

6. The method of claim 5, wherein each of the plurality of first elements has a width of between about 10 microns and about 5000 microns and each of the plurality of second elements has a width of between about 10 microns and about 5000 microns.

7. The method of claim 5, wherein the plurality of substantially parallel first elements and the plurality of substantially parallel second elements are linear and intersect perpendicularly.

8. The method of claim 1, wherein the preformed pattern has a tapered cross sectional shape, being wider at the outer surface of the electrically conductive mandrel.

9. The method of claim 1, wherein the electrically conductive mandrel has a first outer surface and a second outer surface opposite the first outer surface, wherein the first outer surface comprises a first preformed pattern and the second outer surface comprises a second preformed pattern.

10. The method of claim 9, wherein the first preformed pattern and the second preformed pattern are different from each other.

11. The method of claim 1, wherein the electrically conductive mandrel is metallic, and wherein the at least one preformed pattern comprises at least one pattern element as a cavity in the electrically conductive mandrel.

12. The method of claim 11, wherein the pattern element is an intersecting trench having three metal sides.

13. The method of claim 11, wherein the electrically conductive mandrel comprises a first layer on the outer surface, and wherein the first layer comprises at least one of a low-adhesion material or a dielectric material.

14. The method of claim 13, wherein the first layer extends at least partially into the pattern element.

15. A method of forming an electrical component for a photovoltaic cell, the method comprising the steps of:
   i) electroforming a metallic article on an electrically conductive mandrel, wherein the electrically conductive mandrel has an outer surface comprising at least one preformed pattern, the preformed pattern comprising a continuous grid pattern coupled to a cell interconnection pattern,
   wherein the metallic article comprises a plurality of electroformed elements formed in the preformed pattern, the plurality of electroformed elements comprising a cell interconnection element coupled to a continuous grid having a plurality of first elements intersecting a plurality of second elements, and wherein the cell interconnection element is configured to directly couple the grid to a neighboring cell; and
   ii) separating the metallic article from the electrically conductive mandrel, wherein the plurality of electroformed elements are interconnected such that the metallic article forms a unitary, free-standing piece when separated from the electrically conductive mandrel;

wherein the preformed pattern has a height and a width, wherein the ratio of the height to the width is an aspect ratio, and wherein the preformed pattern has an aspect ratio greater than 0.1; and wherein the plurality of electroformed elements are configured to serve as an electrical conduit for a light-incident surface of a photovoltaic cell.

16. The method of claim 15, wherein the step of electroforming comprises overplating the electroformed elements such that the electroformed elements extend above the outer surface of the electrically conductive mandrel.

17. The method of claim 16, wherein the overplating forms a rounded top.

18. The method of claim 16, wherein a top surface of the overplating provides an optical surface that aids in light collection for the photovoltaic cell.

19. The method of claim 15, wherein the preformed pattern has a tapered cross sectional shape, being wider at the outer surface of the electrically conductive mandrel.

20. The method of claim 19, wherein the step of electroforming comprises overplating the electroformed elements such that the electroformed elements extend above the outer surface of the electrically conductive mandrel.

21. The method of claim 15, wherein the cell interconnection element comprises a bus bar.

22. The method of claim 21, wherein the cell interconnection element has a height that is less than the height of the continuous grid.

23. The method of claim 15, wherein the aspect ratio is between about 0.1 and about 1.

* * * * *